(12) United States Patent
Lee et al.

(10) Patent No.: US 11,342,911 B2
(45) Date of Patent: May 24, 2022

(54) GATE DRIVER BOOTSTRAP CIRCUITS AND RELATED METHODS

(71) Applicant: Texas Instruments Incorporated, Dallas, TX (US)

(72) Inventors: Kyoung Min Lee, Cary, NC (US); Satish Kumar Vemuri, Raleigh, NC (US); James Michael Walden, Apex, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 141 days.

(21) Appl. No.: 16/801,746

(22) Filed: Feb. 26, 2020

(65) Prior Publication Data

US 2021/0119627 A1  Apr. 22, 2021

Related U.S. Application Data

(60) Provisional application No. 62/923,343, filed on Oct. 18, 2019.

(51) Int. Cl.
*H03K 17/567* (2006.01)
*H02M 1/08* (2006.01)
(Continued)

(52) U.S. Cl.
CPC .......... *H03K 17/567* (2013.01); *H02M 1/08* (2013.01); *H02M 7/53871* (2013.01); *H02P 27/08* (2013.01)

(58) Field of Classification Search
CPC .. H02P 27/08; H02P 6/085; H02P 1/00; H02P 1/445; H02P 27/06; H02P 1/04; H02K 11/33; H02M 1/08; H02M 2001/0006; H02M 7/53871; H02M 1/084; H02M 7/53873; H02M 2007/53876;
(Continued)

(56) References Cited

U.S. PATENT DOCUMENTS 5,532,626 A * 7/1996 Khayat ................ G01R 19/155
                                                          323/282
10,063,224 B2 * 8/2018 Sato ........................ H02M 1/32
(Continued)

FOREIGN PATENT DOCUMENTS

WO      2019026045 A1    2/2019

OTHER PUBLICATIONS

Search Report for Application No. PCT/US 2020/056303, dated Feb. 11, 2021.

*Primary Examiner* — Antony M Paul
(74) *Attorney, Agent, or Firm* — Michael T. Gabrik; Charles A. Brill; Frank D. Cimino

(57) ABSTRACT

Gate driver bootstrap circuits and related methods are disclosed. An example gate driver stage includes a first terminal and a second terminal, the first terminal to be coupled to a capacitor, the capacitor and the second terminal to be coupled to a gate terminal of a power transistor, a gate driver coupled to the first terminal and the second terminal, and a bootstrap circuit coupled to the first terminal, the second terminal, and the gate driver, the bootstrap circuit including a control stage circuit having an output and a first transistor having a first gate terminal and a first current terminal, the first gate terminal coupled to the output, the first current terminal coupled to the first terminal.

34 Claims, 11 Drawing Sheets

(51) Int. Cl.
*H02M 7/5387* (2007.01)
*H02P 27/08* (2006.01)

(58) Field of Classification Search
CPC ........ H02M 1/4233; H02M 3/07; H02M 3/18; H02M 5/08; H02M 7/42; H02M 7/5395; H02M 2007/4835; H03K 17/60; H03K 2217/0081; H03K 17/567
See application file for complete search history.

(56) References Cited

U.S. PATENT DOCUMENTS

| | | |
|---|---|---|
| 10,587,262 B1 * | 3/2020 | Morini .................... H02M 1/08 |
| 2005/0100330 A1 | 5/2005 | Su et al. |
| 2015/0042298 A1 * | 2/2015 | Kung .................... H02M 3/158 323/271 |
| 2018/0309435 A1 | 10/2018 | Sakai et al. |
| 2019/0140637 A1 * | 5/2019 | Chen .................... H03K 17/063 |

* cited by examiner

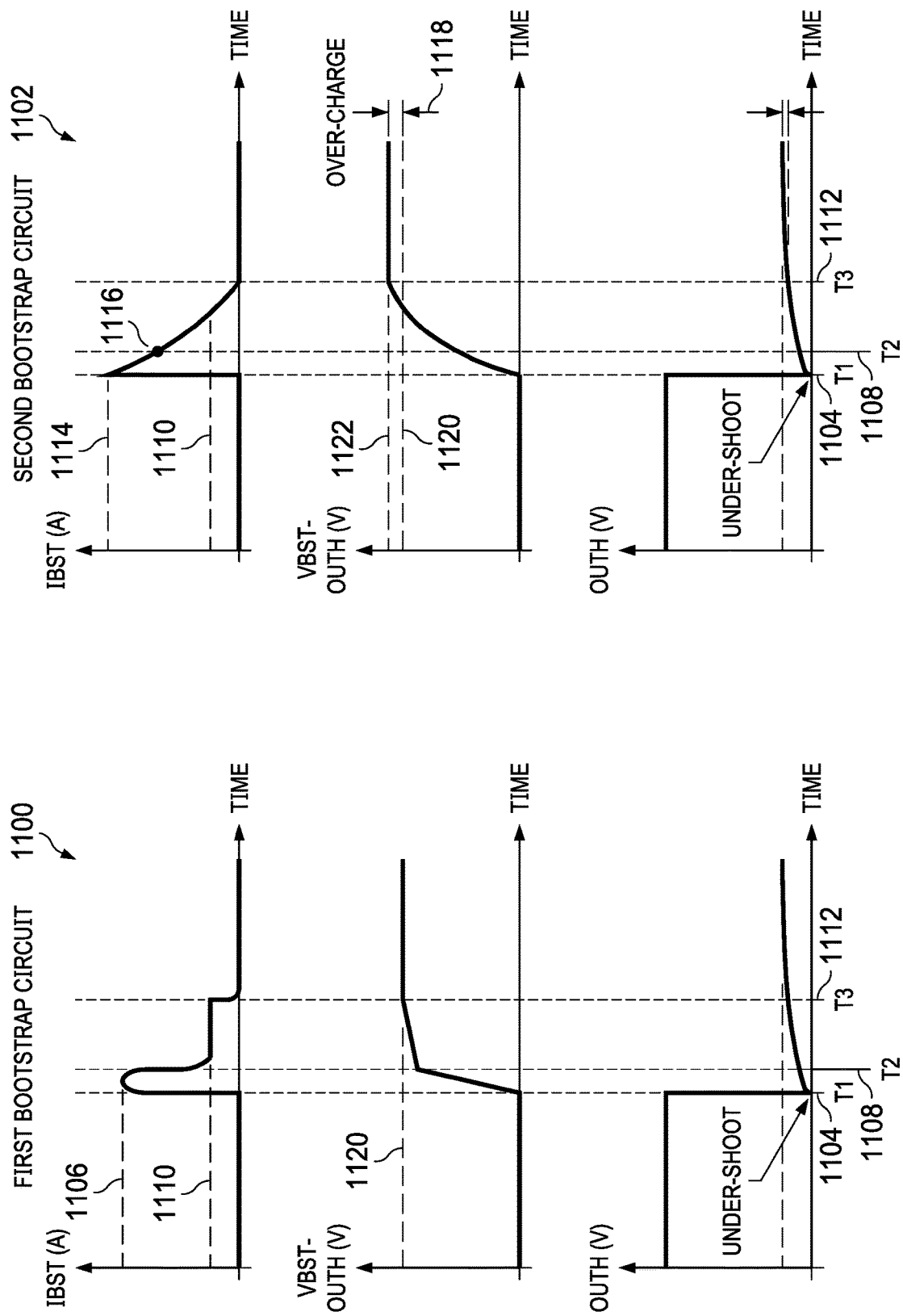

GATE DRIVER BOOTSTRAP CIRCUITS AND RELATED METHODS

RELATED APPLICATION

This patent arises from an application claiming the benefit of U.S. Provisional Patent Application Ser. No. 62/923,343, which was filed on Oct. 18, 2019. U.S. Provisional Patent Application Ser. No. 62/923,343 is hereby incorporated herein by reference in its entirety. Priority to U.S. Provisional Patent Application Ser. No. 62/923,343 is hereby claimed.

FIELD OF THE DISCLOSURE

This disclosure relates generally to gate drivers, and, more particularly, to gate driver bootstrap circuits and related methods.

BACKGROUND

High-voltage and/or high-current applications require power electronic devices capable of efficient and effective operation at various operating conditions. In such applications, power modules deliver power using power devices such as, metal-oxide-semiconductor field-effect transistors (MOSFETs), insulated-gate bipolar transistors (IGBTs), etc. A driver may be used to control a power device used as a power delivering device to support delivering power to a load.

BRIEF DESCRIPTION OF THE DRAWINGS

FIG. 1A is a timing diagram corresponding to example operation of the example bootstrap circuit of FIGS. 2, 3, 4, and/or 5 associated with a gate driver output undershoot condition.

FIG. 11B is a timing diagram corresponding to example operation of the example bootstrap circuit of FIG. 7 associated with a gate driver output undershoot condition.

DETAILED DESCRIPTION

Figure 1:
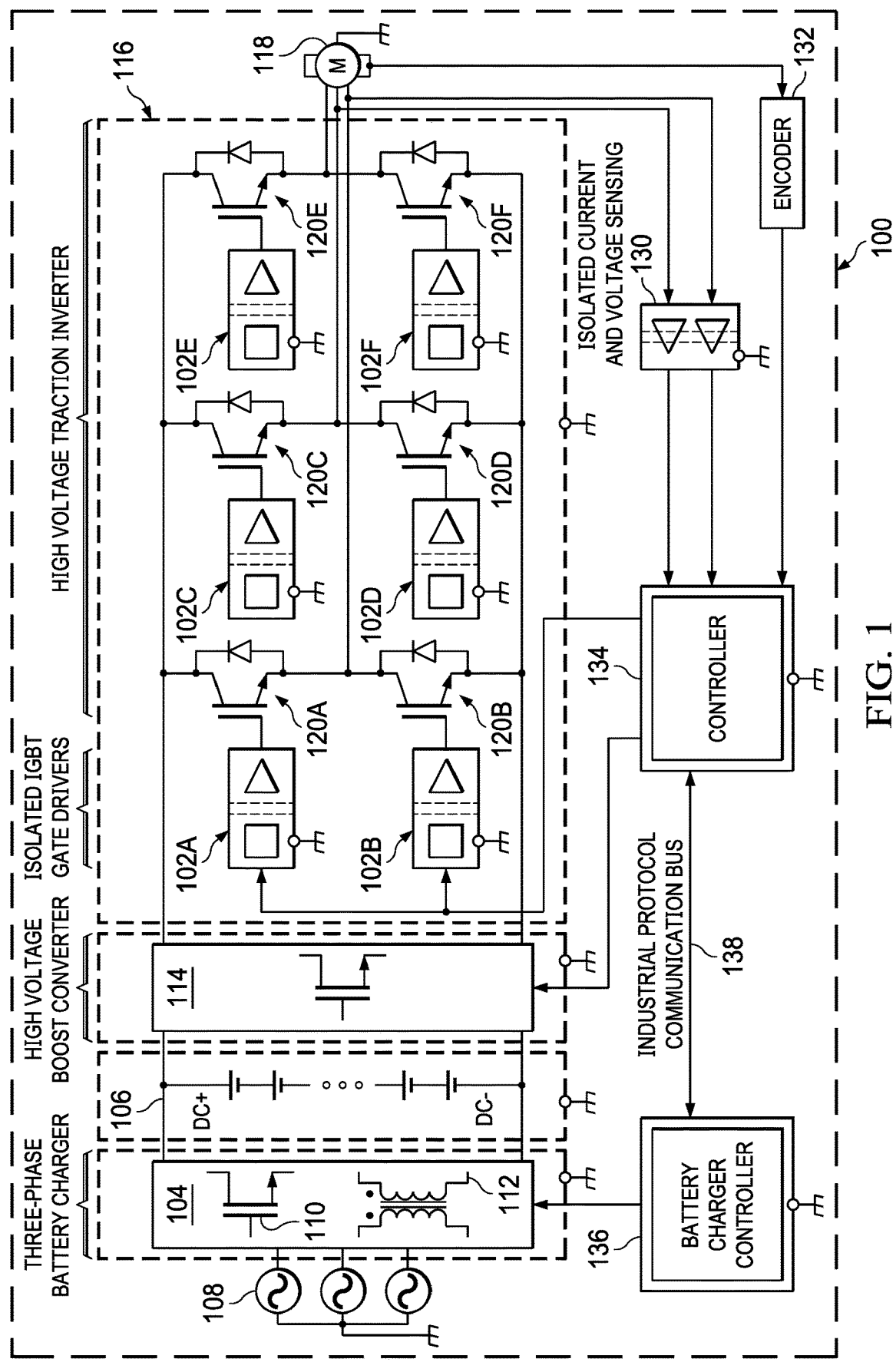
FIG. 1 is a schematic illustration of an example electric or hybrid vehicle high-voltage power electronics system including an example controller and an example gate driver integrated device.

The figures are not to scale. In general, the same reference numbers will be used throughout the drawing(s) and accompanying written description to refer to the same or like parts. As used herein, connection references (e.g., attached, coupled, connected, and joined) are to be construed in light of the specification and, when pertinent, the surrounding claim language. Construction of connection references in the present application shall be consistent with the claim language and the context of the specification, which describes the purpose for which various elements are connected or coupled. As such, connection references do not necessarily infer that two elements are directly connected or directly coupled and in fixed relation to each other.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Descriptors "first," "second," "third," etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

The automotive traction market is an area that can quickly ramp up in upcoming years due to increasing global government regulations of carbon dioxide ($CO_2$) emissions. For example, California, France, and the United Kingdom have proclaimed that they will end sales of internal combustion engines (ICEs) by 2040.

High-voltage and/or high-current isolated gate driver environments and applications, such as a traction inverter in an electric vehicle (EV), a hybrid-electric vehicle (HEV), etc., require power electronic devices capable of efficient and effective operation at elevated temperatures. Power delivery and/or management modules can deliver power using low-impedance insulated-gate bipolar transistors (IGBTs), metal-oxide-semiconductor field-effect transistors (MOSFETs), etc., made from Silicon Carbide (SiC) or any other material. For instance, a power silicon carbide transistor can be used to deliver tens or hundreds of amperes to a load during normal operation.

In a traction application (e.g., in a traction inverter of an EV or HEV vehicle), gate drivers with high-output current are used to drive large power devices. Technical constraints exist for designing large-current output drivers. For instance, P-type devices (e.g., a P-Channel field-effect transistor (FET) (e.g., P-Channel MOSFET), IGBT, etc.) consume large die areas. In such instances, N-type devices (e.g., N-Channel FET (e.g., N-Channel MOSFET), IGBT, etc.) can be used in place of P-type devices by driving gates of the N-type devices with a charge-pump or a bootstrap (e.g., a bootstrap circuit). Another technical constraint can be to improve power efficiency, reliability, and safety of high-voltage and/or high-current power devices while reducing die area of the power devices.

In some instances, a gate driver (e.g., a gate driver operating in the traction application) may include a conventional bootstrap circuit that does not generate enough current in response to short or narrow negative pulses generated by the gate driver. For instance, a gate driver output (e.g., a high-side (HS) gate driver output) may not be lowered to a reference voltage (e.g., not lowered all the way to 0 volts (V)). In such instances, peak current delivered to the gate driver by the bootstrap circuit can be lower than desired because the peak current is based on the HS gate driver output. Accordingly, a lower HS gate driver voltage output can cause a lower peak current.

In some instances, a gate driver (e.g., a gate driver operating in the traction application) may include a conventional bootstrap circuit that is not configured to reduce current generated by the bootstrap circuit in response to a short-circuit condition. For instance, an integrated circuit (IC) terminal (e.g., an electrical connection, a leg, a pin, etc.) may be shorted to ground (e.g., a ground rail, a reference rail, etc.). In such instances, the bootstrap circuit can generate current at a relatively high level for a period of time that can cause damage to the gate driver or other associated electrical components.

In some instances, a gate driver (e.g., a gate driver operating in the traction application) may include a conventional bootstrap circuit that generates current that can cause an over-charge condition of a capacitor associated with the bootstrap circuit. The capacitor may be used to boost a voltage at an input of the gate driver. For instance, the gate driver may generate a gate driver output (e.g., a HS gate driver output) that is less than a reference voltage (e.g., less than 0 V). In such instances, the bootstrap circuit can overcharge the capacitor, which can overcharge the capacitor and cause damage to the gate driver or other associated electrical components.

Examples disclosed herein include example bootstrap circuits to improve operation of example gate drivers. In some disclosed examples, a bootstrap circuit is coupled to a HS output of a gate driver. For example, the bootstrap circuit can be a HS output-referenced bootstrap circuit. In such examples, the bootstrap circuit can be configured to use a reference voltage of the HS output. In some disclosed examples, the bootstrap circuit includes a voltage regulation loop circuit to reduce and/or otherwise eliminate overcharging of a capacitor associated with the bootstrap circuit. In such disclosed examples, the voltage regulation loop circuit reduces power consumption of the bootstrap circuit when not needed to bootstrap the gate driver to a specified output.

In some disclosed examples, the bootstrap circuit includes a control stage circuit and a first current limiting circuit configured to protect the control stage circuit from exceeding a pre-defined current density (e.g., a maximum current density, a peak current density, etc.) and/or a safe-operating area (SOA) of components included in the gate driver, and/or, more generally, the gate driver. In some disclosed examples, the bootstrap circuit includes a second current limiting circuit configured to be triggered and/or otherwise invoked after a pre-defined or pre-determined time delay to protect components included in the gate driver, and/or, more generally, the gate driver during a short-circuit condition. Advantageously, the example bootstrap circuits disclosed herein can improve the reliability, safety, and/or operating lifetime of electrical components included in safety-related applications, such as gate drivers or other integrated circuits included in a traction inverter or other electrical or electronic assembly included in an EV, an HEV, etc.

FIG. 1 is a schematic illustration of an example high-voltage power electronics system 100 including example gate driver integrated devices 102A-F. In the example of FIG. 1, the gate driver integrated devices 102A-F include a first example gate driver integrated device 102A, a second example gate driver integrated device 102B, a third example gate driver integrated device 102C, a fourth example gate driver integrated device 102D, a fifth example gate driver integrated device 102E, and a sixth example gate driver integrated device 102F. Alternatively, the high-voltage power electronics system 100 may include fewer or more gate driver integrated devices than the gate driver integrated devices 102A-F depicted in FIG. 1.

In the illustrated example of FIG. 1, the high-voltage power electronics system 100 is a vehicle high-voltage power electronics system included in an EV, an HEV, etc. Alternatively, the high-voltage power electronics system 100 may be used in any other high-voltage application (e.g., a 200 volt (V) power delivery application, a 400 V power delivery application, a 650 V power delivery application, etc.).

In the illustrated example of FIG. 1, the high-voltage power electronics system 100 includes an example three-phase battery charger 104 to convert alternating current (AC) power to direct current (DC) power to charge an example battery source 106. In the example of FIG. 1, the three-phase battery charger 104 is coupled to the battery source 106. In the example of FIG. 1, the three-phase battery charger 104 is a three-phase rectifier that converts AC power from an example mains grid 108 to DC power to charge one or more high-voltage batteries of the battery source 106. Alternatively, the three-phase battery charger 104 may be replaced with a battery charger having two or fewer phases or more than three phases. In FIG. 1, the battery source 106 includes one or more lithium-ion batteries. Alternatively, the battery source 106 may include a different type of battery or a combination of different battery types.

In the illustrated example of FIG. 1, the three-phase battery charger 104 is a two-stage architecture. In the example of FIG. 1, the two-stage architecture includes an example first stage 110 corresponding to a front-end power factor correction (PFC) stage and a second example stage 112 corresponding to an isolated DC/DC converter. For example, the first stage 110 can be an active PFC circuit including a multi-phase rectifier, a control circuit, and a power transistor. In such examples, the first stage 110 can be configured to convert the AC power from the mains grid 108 to DC power. The control circuit can be configured to measure the DC input voltage and/or current then adjust a switching time, a duty cycle, etc., to ensure that the DC input voltage and/or current are in phase, reduce switching loss, reduce switching noise, etc., and/or a combination thereof. In other examples, the second stage 112 can be a converter (e.g., a flyback converter, a boost converter, etc.) configured to effectuate soft switching and to reduce electro-magnetic interference (EMI).

In the illustrated example of FIG. 1, the battery source 106 is coupled to an example power converter 114. In the example of FIG. 1, the power converter 114 is a high-voltage boost converter. For example, the power converter 114 can be configured to boost the voltage of the battery source 106 to hundreds of volts (e.g., 200 V, 400 V, 600 V, etc.) in examples where the voltage of the battery source 106 is relatively low (e.g., 12 V, 24 V, etc.). Alternatively, the power converter 114 of FIG. 1 may include more than one of the power converter 114 and/or a different type of power converter (e.g., a buck converter, a buck-boost converter, etc.).

In the illustrated example of FIG. 1, the power converter 114 is coupled to an example traction inverter 116. In the example of FIG. 1, the traction inverter 116 is a high-voltage traction inverter that is configured to convert DC current from the power converter 114 to AC current to control a rotation of an example motor 118 by generating a rotating magnetic field. In FIG. 1, the motor 118 is a three-phase electric motor. For example, the motor 118 can be a three-phase electric motor configured to be included in an EV, an HEV, etc. Alternatively, the motor 118 may be configured to be controlled using fewer or more than three phases.

In the illustrated example of FIG. 1, the traction inverter 116 includes the gate driver integrated devices 102A-F to effectuate the switching and/or otherwise operation of example transistors (e.g., power transistors) 120A-F. In the example of FIG. 1, the transistors 120A-F include a first example transistor 120A, a second example transistor 120B, a third example transistor 120C, a fourth example transistor 120D, a fifth example transistor 120E, and a sixth example transistor 120F. Alternatively, there may be fewer or more transistors than the transistors 120A-F depicted in the example of FIG. 1.

In the illustrated example of FIG. 1, the transistors 120A-F are N-Channel transistors (e.g., N-Channel field-effect transistors (FETs), N-Channel IGBTs, etc.). For example, one or more of the transistors 120A-F can be Silicon Carbide (SiC) N-Channel transistors, Silicon (Si) N-Channel transistors, etc., and/or a combination thereof. Alternatively, the traction inverter 116 may be implemented using P-channel transistors (e.g., P-Channel FETs, P-Channel IGBTs, etc.). For example, one or more of the transistors 120A-F can be SiC P-channel transistors, Si P-Channel transistors, etc., and/or a combination thereof.

In the illustrated example of FIG. 1, the transistors 120A-F are IGBTs. For example, one or more of the transistors 120A-F can be SiC N-Channel IGBTs, Si N-Channel IGBTs, etc., and/or a combination thereof. Alternatively, the traction inverter 116 may be implemented using FETs (e.g., power FETs, MOSFETs, power MOSFETs, etc.) in place of and/or in addition to the IGBTs depicted in the example of FIG. 1. For example, one or more of the transistors 120A-F can be SiC N-Channel FETs (e.g., SiC N-Channel MOSFETs), SiC P-Channel FETs (e.g., SiC P-Channel MOSFETs), Si N-Channel FETs (e.g., Si N-Channel MOSFETs), Si P-Channel FETs (e.g., Si P-Channel MOSFETs), etc., and/or a combination thereof. In such examples, one or more of the transistors 120A-F can be SiC FETs, Si FETs, etc.

In the illustrated example of FIG. 1, the first gate driver integrated device 102A is coupled to the first transistor 120A. In FIG. 1, the second gate driver integrated device 102B is coupled to the second transistor 120B. In FIG. 1, the third gate driver integrated device 102C is coupled to the third transistor 120C. In FIG. 1, the fourth gate driver integrated device 102D is coupled to the fourth transistor 120D. In FIG. 1, the fifth gate driver integrated device 102E is coupled to the fifth transistor 120E. In FIG. 1, the sixth gate driver integrated device 102F is coupled to the sixth transistor 120F.

In the illustrated example of FIG. 1, the gate driver integrated devices 102A-F are integrated circuits that control switching operations of the transistors 120A-F. In some examples, the gate driver integrated devices 102A-F include a bootstrap circuit (e.g., a first example bootstrap circuit 232 depicted in FIGS. 2, 3, 4, and/or 5) that is configured to have a cut-off reference voltage that is based on an output of the gate driver integrated devices 102A-F. In such examples, the bootstrap circuit can be configured to reduce and/or otherwise eliminate overcharging of a bootstrap capacitor associated with the bootstrap circuit. In some such examples, the bootstrap circuit can be configured to reduce overcharging of the bootstrap capacitor even when the output is reduced below a zero-voltage threshold.

In some examples, the gate driver integrated devices 102A-F include a bootstrap circuit to increase a charging rate of a bootstrap capacitor while improving reliability, safety, and/or operating lifetime of corresponding one(s) of the transistors 120A-F and/or, more generally, the high-voltage power electronics system 100. For example, the bootstrap circuit can include a first current limiting circuit that can be triggered and/or otherwise invoked in response to activating, turning on, etc., the high-voltage power electronics system 100 to increase the charging rate of the bootstrap capacitor. In some examples, the bootstrap circuit can trigger the first current limiting circuit to charge the bootstrap capacitor within a pre-defined width of a negative pulse signal generated by the gate driver integrated devices 102A-F. In some such examples, the bootstrap circuit can charge the bootstrap capacitor relatively quickly (e.g., less than 250 nanoseconds (ns), less than 300 ns, etc.) and with enough current (e.g., 200 milliamps (mA) of current, 250 mA of current, etc.).

In some examples, the bootstrap circuit of corresponding one(s) of the gate driver integrated devices 102A-F includes a second current limiting circuit that can be triggered and/or otherwise invoked in response to a pre-defined time period having elapsed to improve the reliability, safety, and/or operating lifetime of the transistors 120A-F and/or, more generally, the high-voltage power electronics system 100. In such examples, the bootstrap circuit can trigger the second current limiting circuit to charge (e.g., further charge) the bootstrap capacitor using a second quantity of current that is less than a first quantity of current generated by the first current limiting circuit. In some such examples, the bootstrap circuit can charge the bootstrap capacitor with the second quantity of current (e.g., 30 milliamps (mA) of current, 45 mA of current, etc.) while preventing heating of corresponding one(s) of the transistors 120A-F beyond a heating threshold level that can lead to damage of the transistors 120A-F.

In the illustrated example of FIG. 1, the high-voltage power electronics system 100 includes example sensing circuitry 130 and an example encoder 132. In the example of FIG. 1, the sensing circuitry 130 is configured to execute isolated current and voltage sensing to measure phase currents and phase voltages generated by the traction inverter 116. For example, the sensing circuitry 130 can include one or more current sensors, one or more voltage sensors, etc., and/or a combination thereof. In FIG. 1, the encoder 132 is a sensor that is configured to measure a speed of the motor 118.

In the illustrated example of FIG. 1, the high-voltage power electronics system 100 includes an example controller 134 that is configured to perform and/or otherwise effectuate closed-loop control of the speed and torque of the motor 118. For example, the controller 134 can increase or decrease a switching speed of the power converter 114 to increase or decrease a voltage delivered to the motor 118 based on measurements from the sensing circuitry 130 and/or the encoder 132. In other examples, the controller 134 can control a speed and/or torque of the motor 118 based on measurements from the sensing circuitry 130 and/or the encoder 132.

In the illustrated example of FIG. 1, the controller 134 can generate and transmits commands, instructions, etc., to an example battery charger controller 136 via an example industrial protocol communication bus 138. In the example of FIG. 1, the battery charger controller 136 is configured to control a conversion of the AC power from the mains grid 108 to DC power based on at least one of a first measurement from the sensing circuitry 130 or a second measurement from the encoder 132. In FIG. 1, the industrial protocol communication bus 138 is a controller area network (CAN) bus that facilitates communication of CAN protocol packets. Alternatively, the controller 134 may control the battery charger controller 136 via any other communication protocol, such as serial peripheral interface (SPI) protocol, Process Field Bus (PROFIBUS) protocol, Modbus protocol, etc.

Figure 2:
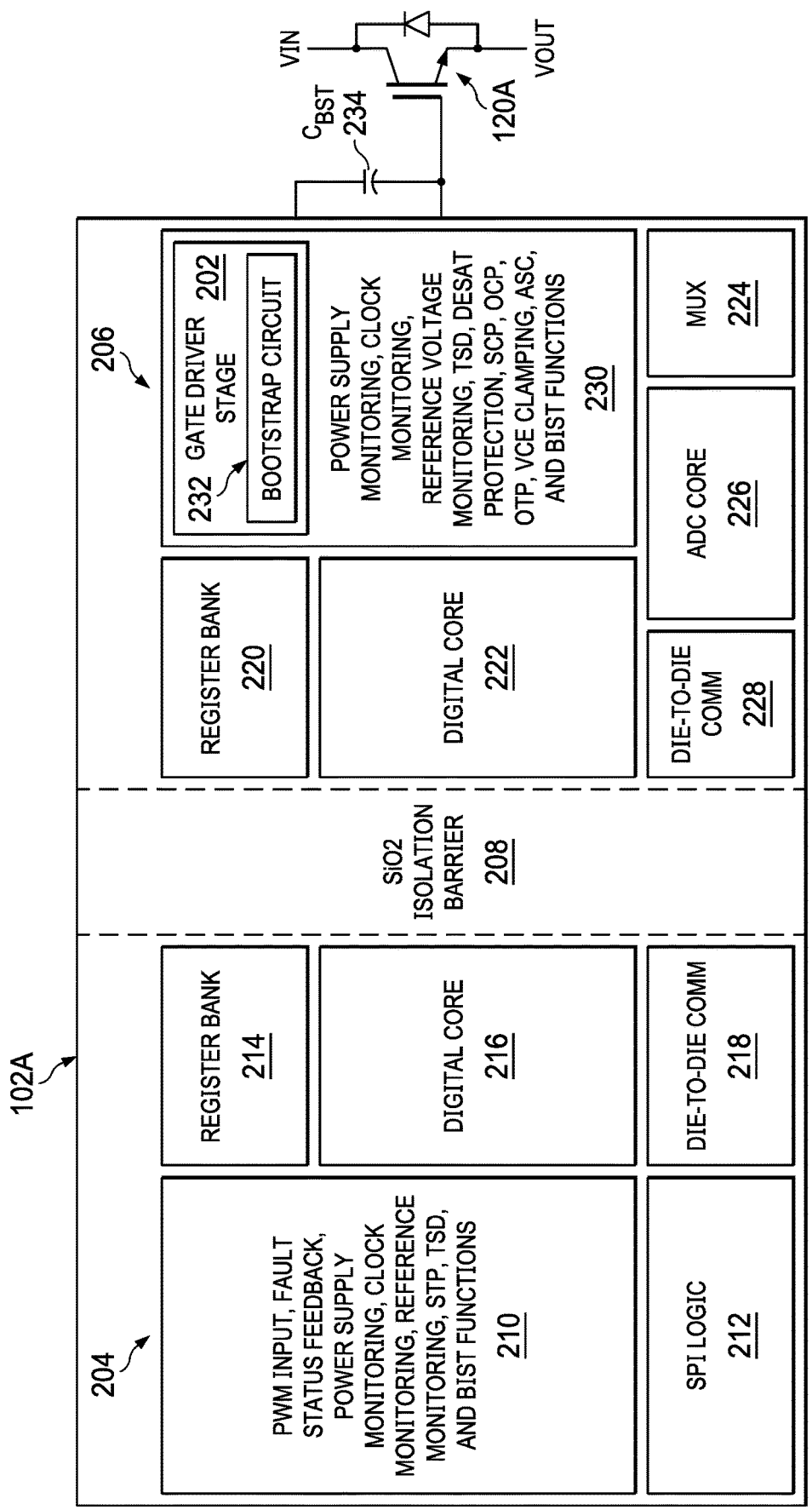
FIG. 2 is a schematic illustration of an implementation of the example gate driver integrated device of FIG. 1 including an example gate driver stage and an example bootstrap circuit.

FIG. 2 is a schematic illustration of an implementation of the first example gate driver integrated device 102A of FIG. 1 including a first example gate driver stage 202. Although the schematic illustration of FIG. 2 represents a single gate driver integrated device 102A, multiple instances of the schematic illustration of FIG. 2 may be used to implement multiple gate driver integrated devices such as the gate driver integrated devices 102A-F of FIG. 1. For example, the description in connection with FIG. 2 can be applicable to one or more of the second through sixth gate driver integrated devices 102B-F of FIG. 1.

In the illustrated example of FIG. 2, the first gate driver integrated device 102A is an isolated single channel gate driver integrated circuit including a first example die 204 and a second example die 206, where the first die 204 is separate from the second die 206 via an example isolation barrier 208. Alternatively, the first gate driver integrated device 102A may be implemented using one die or more than two dies. In the example FIG. 2, the isolation barrier 208 is a silicon dioxide ($SiO_2$) isolation barrier. Alternatively, the isolation barrier 208 may be any other type of isolation barrier. In FIG. 2, the dies 204, 206 are silicon dies. Alternatively, one or both dies 204, 206 may be implemented using different types of dies (e.g., Gallium Arsenide (GaAs) dies).

In the illustrated example of FIG. 2, the first gate driver stage 202 is implemented on the second die 206. Alternatively, the first gate driver stage 202 may be implemented on the first die 204. Alternatively, a first portion of the first gate driver stage 202 may be implemented on the first die 204 and a second portion of the first gate driver stage 202 may be implemented on the second die 206. Alternatively, in other examples, the first gate driver stage 202 and/or any of the components shown in the first gate driver integrated device 102A of FIG. 1 may be implemented on a plurality of dies and/or a plurality of integrated circuits.

In the illustrated example of FIG. 2, the first die 204 of the first gate driver integrated device 102A includes first example logic circuitry 210 including one or more logic circuits to effectuate pulse-width modulation (PWM) inputs (e.g., generating PWM inputs), fault status feedback, power supply monitoring, clock monitoring, reference (voltage) monitoring, shoot-through protection (STP), thermal shutdown (TSD), and built-in self-test (BIST) functions. For example, the first logic circuitry 210 can include a first logic circuit to receive and propagate PWM signals. In such examples, the first logic circuitry 210 can include a second logic circuit to monitor a voltage of a power supply of the first gate driver integrated device 102A, a third logic circuit to monitor a clock signal received by the first gate driver integrated device 102A, etc.

In the illustrated example of FIG. 2, the first die 204 of the first gate driver integrated device 102A includes example SPI logic 212, a first example register bank 214, a first example digital core 216, and a first example die-to-die communication (COMM) circuit 218. In the example of FIG. 2, the first gate driver integrated device 102A includes the SPI logic 212 to effectuate reconfiguration, verification, supervision, and diagnosis of the first gate driver integrated device 102A. For example, the SPI logic 212 obtains and/or otherwise can be configured to obtain commands to program a setting of the first gate driver integrated device 102A. In the example of FIG. 2, the first gate driver integrated device 102A includes the first register bank 214 to store data. For example, the first register bank 214 can correspond to non-volatile memory (e.g., read-only memory (ROM), electrically erasable programmable read-only memory (EEPROM), flash memory, etc.), volatile memory (e.g., Synchronous Dynamic Random Access Memory (SDRAM), Dynamic Random Access Memory (DRAM), etc.

In the illustrated example of FIG. 2, the first gate driver integrated device 102A includes the first digital core 216 to provide and/or otherwise effectuate the handling of startup and shutdown sequences of various blocks or components depicted in the first die 204. The first digital core 216 can be configured to act and/or otherwise execute as a communication hub between one or more of the blocks, components, logic circuitry, etc., depicted in the first die 204. For example, the SPI logic 212 can be configured to interface with the first register bank 214 through the first digital core 216. In FIG. 2, the first gate driver integrated device 102A includes the first die-to-die communication circuit 218 to effectuate a transmission to and/or a reception of data from the second die 206.

In the illustrated example of FIG. 2, the second die 206 of the first gate driver integrated device 102A includes a second example register bank 220, a second example digital core 222, an example multiplexer (MUX) 224, an example analog-to-digital converter (ADC) core 226, and a second die-to-die communication circuit 228. In the example of FIG. 2, the first gate driver integrated device 102A includes the second register bank 220 to store data. For example, the second register bank 220 can correspond to non-volatile memory, volatile memory, etc.

In the illustrated example of FIG. 2, the first gate driver integrated device 102A includes the second digital core 222 to execute the handling of startup and shutdown sequences of various blocks, logic circuitry, components, etc., depicted in the second die 206. The second digital core 222 is configured to act and/or otherwise execute as a communication hub between one or more of the blocks, logic circuitry, components, etc., depicted in the second die 206. For example, the die-to-die communication circuit 228 can be configured to interface with the second register bank 220 through the second digital core 222.

In the illustrated example of FIG. 2, the first gate driver integrated device 102A includes the multiplexer 224 to switch one of several input lines through to a single common output line by the application, generation, etc., of a control signal. For example, the multiplexer 224 can be configured to switch one of several analog inputs associated with the first transistor 120A of FIG. 2, such as an emitter current measurement of the first transistor 120A, a gate voltage measurement of the first transistor 120A, etc. In the example of FIG. 2, the first gate driver integrated device 102A includes the ADC core 226 to convert one or more analog signals to one or more digital signals. For example, the ADC core 226 can be configured to convert an emitter current, a gate voltage, etc., of the first transistor 120A to a digital representation value (e.g., a binary value, a hex value, a logic zero '0', a logic one '1', etc.). In FIG. 2, the first gate driver integrated device 102A includes the second die-to-die communication circuit 228 to effectuate a transmission to and/or a reception of data from the first die 204.

In the illustrated example of FIG. 2, the second die 206 of the first gate driver integrated device 102A includes second example logic circuitry 230 including one or more logic circuits to effectuate power supply monitoring, clock monitoring, reference voltage monitoring, TSD, desaturation (DESAT) protection, short circuit protection (SCP), over current protection (OCP), over temperature protection (OTP), VCE clamping, active short circuit (ASC) support, and BIST functions. For example, the second logic circuitry 230 can include one or more logic circuits to implement shunt resistor sensing based OCP and SCP functions. In other examples, the second logic circuitry 230 can include one or more logic circuits to implement OTP functions by sensing a junction temperature of the first transistor 120A, one or more logic circuits to monitor a clock signal received by the first gate driver integrated device 102A, etc.

In the illustrated example of FIG. 2, the second die 206 of the first gate driver integrated device 102A includes the first gate driver stage 202 to effectuate switching operations of the first transistor 120A. In the example of FIG. 2, the first gate driver stage 202 is implemented on the second die 206. Alternatively, the first gate driver stage 202 may be implemented on the first die 204. Alternatively, the first gate driver stage 202 may be implemented on both the first die 204 and the second die 206. Alternatively, in other examples, the first gate driver stage 202 and/or any of the components shown in the first gate driver integrated device 102A may be implemented on a plurality of dies and/or a plurality of integrated circuits.

In the illustrated example of FIG. 2, the first gate driver integrated device 102A includes the first gate driver stage 202 to turn on or off the first transistor 120A. For example, the first gate driver stage 202 can include a first gate driver and a first gate driver transistor (e.g., a power transistor, an N-Channel MOSFET, a P-Channel MOSFET, etc.) and a second gate driver and a second gate driver transistor (e.g., a power transistor, an N-Channel MOSFET, a P-Channel MOSFET, etc.).

In the illustrated example of FIG. 2, the first transistor 120A is configured in an arrangement to deliver current to a voltage output (VOUT) node, which can be coupled (e.g., configured to be coupled) to a load such as the motor 118 of FIG. 1. For example, the first transistor 120A can be coupled to an input of the motor 118, the sensing circuitry 130, and/or the encoder 132 of FIG. 1. Alternatively, the first transistor 120A may be coupled to any other type of load such as a battery (e.g., a lithium-ion battery).

In some examples, the first gate driver and the first gate driver transistor can be configured to pull up agate voltage of the first transistor 120A. In some such examples, the first gate driver transistor can pull up the gate voltage to cause a gate-to-source voltage (VGS) of the first transistor 120A to be above a threshold voltage (VTH) of the first transistor 120A. For example, the first transistor 120A can be configured to turn on when the gate voltage is greater than VTH.

In some examples, the second gate driver and the second gate driver transistor can be configured to pull down the gate voltage of the first transistor 120A. In such examples, the second gate driver transistor can pull down the gate voltage to cause the VGS of the first transistor 120A to be below VTH of the first transistor 120A. For example, the first transistor 120A can be configured to turn off when the gate voltage is less than VTH.

In the illustrated example of FIG. 2, the first gate driver stage 202 includes a first example bootstrap circuit 232 that is configured to have a cut-off reference voltage that is based on an output of the first gate driver stage 202. In such examples, the first bootstrap circuit 232 can be configured to reduce and/or otherwise eliminate overcharging of an example bootstrap capacitor (CBST) 234 associated with the first bootstrap circuit 232. In some such examples, the first bootstrap circuit 232 can be configured to reduce overcharging of the bootstrap capacitor 234 even when the output of the first gate driver stage 202 is reduced below a zero-voltage threshold (e.g., less than 0 V).

In some examples, the first bootstrap circuit 232 is configured to increase a charging rate of the bootstrap capacitor 234 while improving reliability, safety, and/or operating lifetime of the first transistors 120A and/or, more generally, the first gate driver integrated device 102A. For example, the first bootstrap circuit 232 can include a first current limiting circuit that can be configured to increase the charging rate of the bootstrap capacitor 234. In some examples, the first bootstrap circuit 232 can include a second current limiting circuit that can be configured to improve the reliability, safety, and/or operating lifetime of the first transistors 120A and/or, more generally, the first gate driver integrated device 102A. In such examples, the first bootstrap circuit 232 can be configured to charge the bootstrap capacitor 234 using a second quantity of current that is less than a first quantity of current generated by the first current limiting circuit. In some such examples, the first bootstrap circuit 232 can charge the bootstrap capacitor 234 with the second quantity of current while preventing overheating of the first transistors 120A beyond a heating threshold level that can lead to damage of the first transistor 120A.

While an example manner of implementing the first gate driver integrated device 102A of FIG. 1 is illustrated in FIG. 2, one or more of the elements, processes, and/or devices illustrated in FIG. 2 may be combined, divided, re-arranged, omitted, eliminated, and/or implemented in any other way. Further, the first gate driver stage 202, the first die 204, the second die 206, the first logic circuitry 210, the SPI logic 212, the first register bank 214, the first digital core 216, the first die-to-die communication 218, the second register bank 220, the second digital core 222, the multiplexer 224, the ADC core 226, the second die to die communication 228, the second logic circuitry 230, the first bootstrap circuit 232, and/or, more generally, the first gate driver integrated device 102A of FIGS. 1 and/or 2 may be implemented by hardware, software, firmware, and/or any combination of hardware, software, and/or firmware. Thus, for example, any of the first gate driver stage 202, the first die 204, the second die 206, the first logic circuitry 210, the SPI logic 212, the first register bank 214, the first digital core 216, the first die-to-die communication 218, the second register bank 220, the second digital core 222, the multiplexer 224, the ADC core 226, the second die-to-die communication 228, the second logic circuitry 230, the first bootstrap circuit 232, and/or, more generally, the first gate driver integrated device 102A could be implemented by one or more analog or digital circuit(s), logic circuits, programmable processor(s), programmable controller(s), graphics processing unit(s) (GPU (s)), digital signal processor(s) (DSP(s)), application specific integrated circuit(s) (ASIC(s)), programmable logic device (s) (PLD(s)), and/or field programmable logic device(s) (FPLD(s)). When reading any of the apparatus or system claims of this patent to cover a purely software and/or firmware implementation, at least one of the first gate driver stage 202, the first die 204, the second die 206, the first logic circuitry 210, the SPI logic 212, the first register bank 214, the first digital core 216, the first die-to-die communication 218, the second register bank 220, the second digital core 222, the multiplexer 224, the ADC core 226, the second die-to-die communication 228, the second logic circuitry 230, and/or the first bootstrap circuit 232 is/are hereby expressly defined to include a non-transitory computer readable storage device or storage disk such as non-volatile memory (e.g., ROM, EEPROM, flash memory, etc.), volatile memory (e.g., SDRAM, DRAM, etc., and/or any other type of RAM device), etc., including the software and/or firmware. Further still, the first gate driver integrated device 102A of FIGS. 1 and/or 2 may include one or more elements, processes, and/or devices in addition to, or instead of, those illustrated in FIG. 2, and/or may include more than one of any or all of the illustrated elements, processes, and devices.

Figure 3:
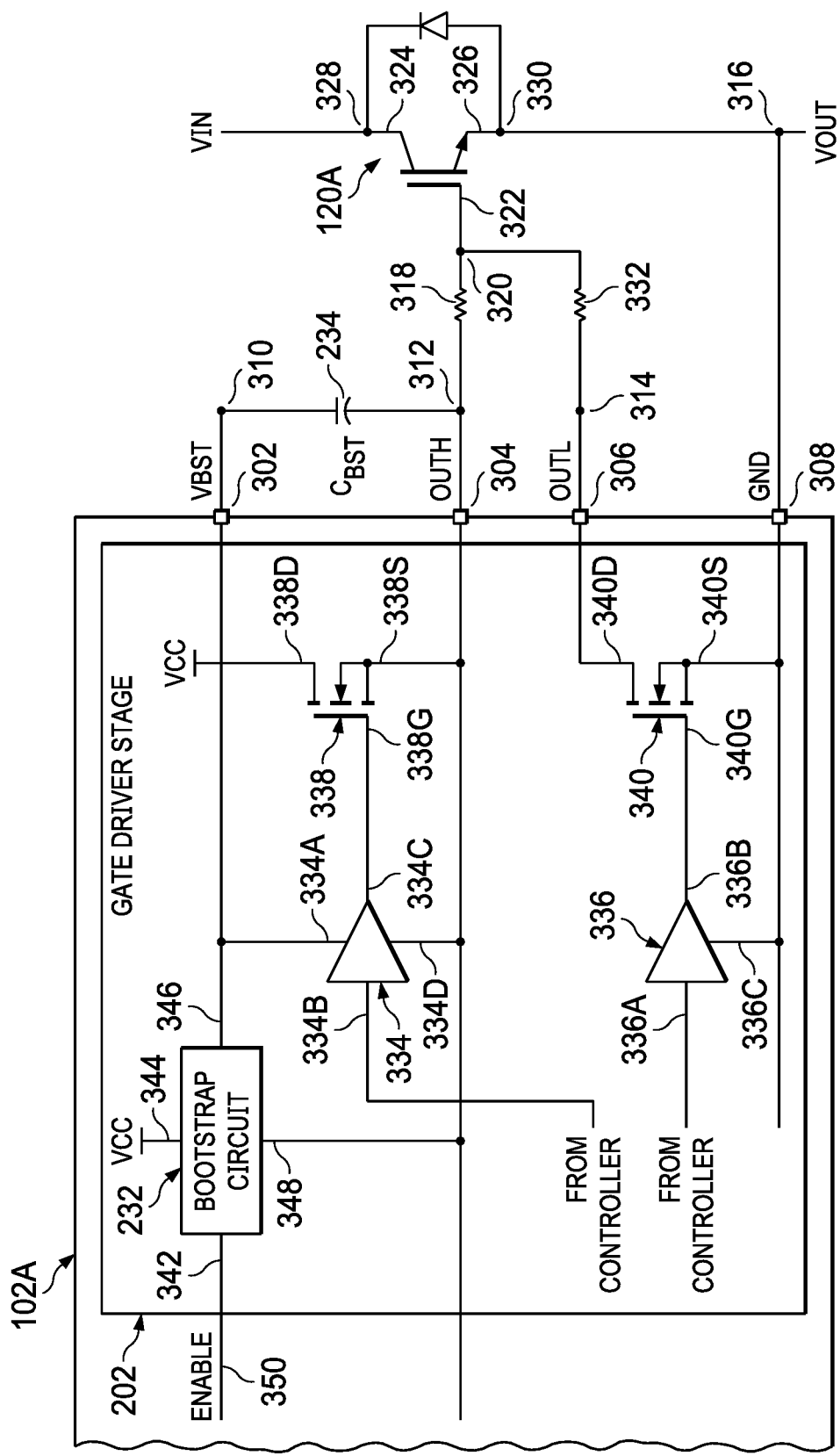
FIG. 3 is a schematic illustration of the example gate driver stage and the example bootstrap circuit of FIG. 2.

FIG. 3 is a schematic illustration of the first example gate driver stage 202 and the first example bootstrap circuit 232 of FIG. 2. In the illustrated example of FIG. 3, the first gate driver stage 202, and/or, more generally, the first gate driver integrated device 102A of FIGS. 1-2 is/are coupled to the first transistor 120A of FIGS. 1-2 via example terminals 302, 304, 306, 308 including a first example terminal (VBST) 302, a second example terminal (OUTH) 304, a third example terminal (OUTL) 306, and a fourth example terminal (GND) 308. For example, the first terminal 302 can be a bootstrap pin configured to bootstrap a voltage associated with the second terminal 304. The second terminal 304 can be a pull-up driver output pin configured to pull up the gate voltage of the first transistor 120A to turn on the first transistor 120A. The third terminal 306 can be a pull-down driver output pin configured to pull down the gate voltage of the first transistor 120A to turn off the first transistor 120A. The fourth terminal 308 can be a power return pin for the pull-down driver or the first transistor 120A (e.g., a source terminal of the first transistor 120A). For example, the fourth terminal 308 can be configured to deliver and/or otherwise provide a reference voltage rail, a ground voltage rail, etc., to the first transistor 120A.

In the illustrated example of FIG. 3, the terminals 302, 304, 306, 308 can be constructed and/or otherwise be composed of aluminum, copper, etc., or any other conductive material or combination thereof. In the example of FIG. 3, the terminals 302, 304, 306, 308 are pins (e.g., IC pins). Alternatively, the terminals 302, 304, 306, 308 may be legs (e.g., conductive legs), lugs (e.g., conductive lugs), or any other type of electrical contact.

In the illustrated example of FIG. 3, the first terminal 302 is coupled (e.g., configured to be coupled) to a first example node 310. In the example of FIG. 3, the second terminal 304 is coupled (e.g., configured to be coupled) to a second example node 312. In FIG. 3, the third terminal 306 is coupled (e.g., configured to be coupled) to a third example node 314. In FIG. 3, the fourth terminal 308 is coupled to a fourth example node 316.

In the illustrated example of FIG. 3, the bootstrap capacitor 234 is coupled to the first node 310 and the second node 312. For example, the first gate driver stage 202, and/or, more generally, the first gate driver integrated device 102A can be configured to be coupled to the bootstrap capacitor 234 via the first node 310 and the second node 312. In the example of FIG. 3, a first capacitor terminal of the bootstrap capacitor 234 is coupled to the first node 310 and a second capacitor terminal of the bootstrap capacitor 234 is coupled to the second node 312.

In the illustrated example of FIG. 3, a first resistor terminal of a first example resistor 318 is coupled to the second node 312 and a second resistor terminal of the first resistor 318 is coupled to a fifth example node 320. For example, the first gate driver stage 202, and/or, more generally, the first gate driver integrated device 102A can be configured to be coupled to the first resistor 318 via the fifth node 320.

In the illustrated example of FIG. 3, the first transistor 120A has an example gate terminal 322, a first example current terminal 324, and a second example current terminal 326. In the example of FIG. 3, the first current terminal 324 is a collector current terminal and the second current terminal 326 is an emitter current terminal.

In the illustrated example of FIG. 3, the gate terminal 322 is coupled (e.g., configured to be coupled) to the fifth node 320. In the example of FIG. 3, the first current terminal 324 is coupled (e.g., configured to be coupled) to a sixth example node 328. In FIG. 3, the sixth node 328 is a voltage input (VIN) node, which can be coupled (e.g., configured to be coupled) to an output of the power converter 114 of FIG. 1). In the example of FIG. 3, the second current terminal 326 is coupled (e.g., configured to be coupled) to a seventh example node 330, which can be coupled to the fourth node 316. In the example of FIG. 3, the fourth node 316 and the seventh node 330 are voltage output (VOUT) nodes, which can be coupled (e.g., configured to be coupled) to an input of the motor 118, the sensing circuitry 130, and/or the encoder 132 of FIG. 1. Alternatively, the fourth node 316 may be combined with the seventh node 330.

In the illustrated example of FIG. 3, a second example resistor 332 is coupled to the third node 314 and the fifth node 320. For example, the first gate driver stage 202, and/or, more generally, the first gate driver integrated device 102A can be configured to be coupled to the second resistor 332 via the third node 314. In the example of FIG. 3, a third resistor terminal of the second resistor 332 is coupled to the third node 314 and a fourth resistor terminal of the second resistor 332 is coupled to the fifth node 320. In the example of FIG. 3, the fourth terminal 308 is coupled (e.g., configured to be coupled) to the fourth node 316.

In the illustrated example of FIG. 3, one or more of the nodes 310, 312, 314, 316, 320, 328, 330 can be constructed and/or otherwise be composed of aluminum, copper, etc., or any other conductive material or combination thereof. For example, one or more of the nodes 310, 312, 314, 316, 320, 328, 330 can be conductive printed circuit board (PCB) pads, vias (e.g., conductive vias), or any other type of electrical contact or interconnection point or combination thereof.

In the illustrated example of FIG. 3, the first transistor 120A, the bootstrap capacitor 234, the first resistor 318, and the second resistor 332 are coupled to the first gate driver stage 202, and/or, more generally, the first gate driver integrated device 102A Alternatively, one or more of the first transistor 120A, the bootstrap capacitor 234, the first resistor 318, and the second resistor 332 may not be coupled to the first gate driver stage 202, and/or, more generally, the first gate driver integrated device 102A. For example, one or more of the first transistor 120A, the bootstrap capacitor 234, the first resistor 318, and the second resistor 332 can be coupled to the first gate driver stage 202, and/or, more generally, the first gate driver integrated device 102A, after the first gate driver stage 202 and/or the first gate integrated device 102 have been assembled and/or otherwise manufactured. In such examples, one or more of the first transistor 120A, the bootstrap capacitor 234, the first resistor 318, and/or the second resistor 332 can be distributed and/or sold separately from the first gate driver stage 202, and/or, more generally, the first gate driver integrated device 102A.

In the illustrated example of FIG. 3, the first gate driver stage 202 includes a first example gate driver 334, a second example gate driver 336, a first example gate driver transistor 338, and a second example gate driver transistor 340. In the example of FIG. 3, the first gate driver 334 is a buffering stage having a first voltage input 334A, a first control input 334B, a first control output 334C, and a first reference voltage input 334D. For example, the first gate driver 334 can drive the first gate terminal 338G with a higher current strength than an output from a controller (e.g., the controller 134 of FIG. 1). In the example of FIG. 3, the second gate driver 336 is a buffering stage having a second control input 336A, a second control output 336B, and a second reference voltage input 336C. For example, the second gate driver 336 can drive the second gate terminal 340G with a higher current strength than an output from a controller (e.g., the controller 134 of FIG. 1). Alternatively, one or both of the gate drivers 334, 336 may be a power amplifier. In FIG. 3, the first control input 334B and the second control input 336A are coupled (e.g., configured to be coupled) to output(s) of a controller, such as output(s) of the controller 134 of FIG. 1.

In the illustrated example of FIG. 3, the first gate driver transistor 338 and the second gate driver transistor 340 are N-Channel MOSFETs. Alternatively, the first gate driver stage 202 may be implemented using P-Channel MOSFETs in place of one or more of the gate driver transistors 338, 340. In the example of FIG. 3, the first gate driver transistor 338 has a first gate terminal 338G, a first current terminal 338D, and a second current terminal 338S. In the example of FIG. 3, the second gate driver transistor 340 has a second gate terminal 340G, a third current terminal 340D, and a fourth current terminal 340S. In FIG. 3, the first current terminal 338D and the third current terminal 340D are drain terminals (e.g., drain current terminals). In FIG. 3, the second current terminal 338S and the fourth current terminal 340S are source terminals (e.g., source current terminals).

In the illustrated example of FIG. 3, the first bootstrap circuit 232 has an example enable input 342, a voltage input (e.g., a VCC input) 344, a bootstrap output 346, and a bootstrap reference voltage input 348. In the example of FIG. 3, the voltage input 344 is a positive power rail, voltage rail, etc., that can deliver a voltage greater than 0 V to the bootstrap circuit 232. In some examples, in response to a rising edge of an example enable signal 350 delivered to the enable input 342, the first bootstrap circuit 232 can be triggered and/or otherwise invoked to execute bootstrap functions, such as charging the bootstrap capacitor 234 via the bootstrap output 346.

In the illustrated example of FIG. 3, the voltage input 344 and the first current terminal 338D are coupled to and/or otherwise are configured to have a voltage of VCC. In the example of FIG. 3, the bootstrap output 346 is coupled to the first voltage input 334A, the first terminal 302, and the bootstrap capacitor 234 via the first terminal 302. In FIG. 3, the first control output 334C is coupled to the first gate terminal 338G and the second control output 336B is coupled to the second gate terminal 340G. In FIG. 3, the bootstrap reference voltage input 348 is coupled to the first reference voltage input 334D, the second current terminal 338S, the second terminal 304, the bootstrap capacitor 234 via the second terminal 304, and the first resistor 318 via the second terminal 304.

In the illustrated example of FIG. 3, the third current terminal 340D is coupled to the third terminal 306, the second resistor 332 via the third terminal 306, and the gate terminal 322 of the first transistor 120A via the third terminal 306 and the second resistor 332. Alternatively, the third current terminal 340D may be coupled to the gate terminal 322 of the first transistor 120A without the second resistor 332. In the example of FIG. 3, the fourth current terminal 340S is coupled to the second reference voltage input 336C, the fourth terminal 308, and the second current terminal 326 via at least one of the fourth node 316 or the seventh node 330.

In example operation, the first bootstrap circuit 232 charges the bootstrap capacitor 234. In response to charging the bootstrap capacitor 234, the bootstrap capacitor 234 can increase the voltage at the first voltage input 334A. Advantageously, by increasing the voltage at the first voltage input 334A, the first gate driver 334 can generate a control signal at the first control output 334C to maintain the first gate driver transistor 338 in an on, enabled, etc., state, in which the first gate driver transistor 338 conducts current generated by VCC. In example operation, the first bootstrap circuit 232 can effectuate the first gate driver 334 to generate a sufficient voltage output at the first control output 334C to ensure that the first gate driver transistor 338 remains in an on state.

Advantageously, the first bootstrap circuit 232 is coupled to the HS output (OUTH) of the first gate driver stage 202 to address short-negative pulses generated by the first gate driver 334. OUTH can correspond to an output voltage (e.g., a HS output voltage) of the first gate driver stage 202. In some examples, the short-negative pulses can cause OUTH to undershoot below power ground (e.g., below a zero-voltage threshold) before the first gate driver 334 invokes the first transistor 120A to return to a high state, an on-state, an enabled state, etc. Advantageously, by coupling the first bootstrap circuit 232 to OUTH instead of the low-side (LS) output (OUTL), the first gate driver stage 202 can reduce and/or otherwise eliminate charging of the bootstrap capacitor 234.

Figure 4:
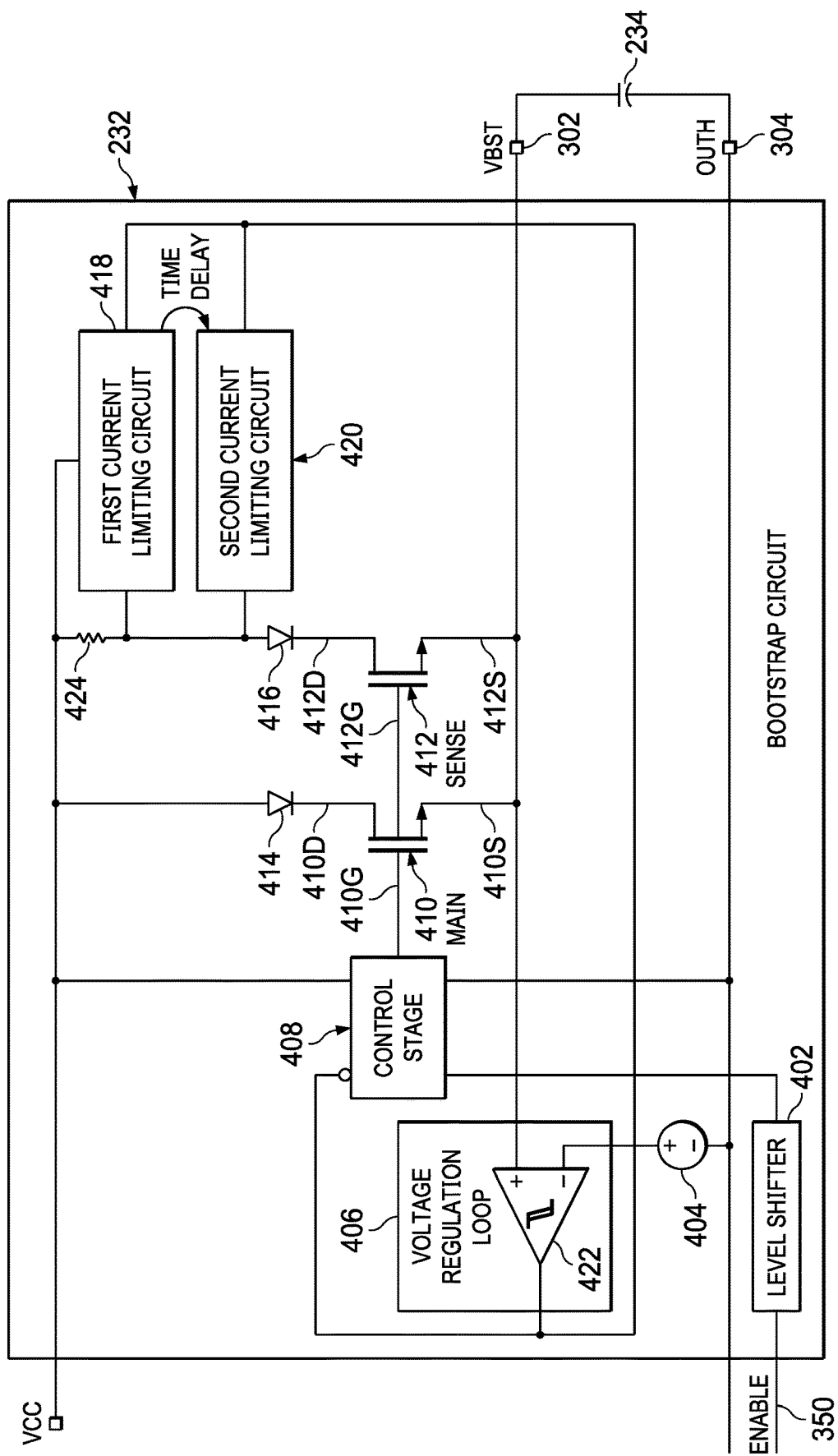
FIG. 4 is a schematic illustration of the example bootstrap circuit of FIGS. 2-3 including an example control stage circuit, a first example current limiting circuit, and a second example current limiting circuit.

FIG. 4 is a schematic illustration of the first example bootstrap circuit 232 of FIGS. 2-3. In the illustrated example of FIG. 4, the first bootstrap circuit 232 includes an example level shifter 402, an example reference voltage circuit 404, an example voltage regulation loop circuit 406, an example control stage circuit 408, a first example transistor (MAIN) 410, a second example transistor (SENSE) 412, a first example diode 414, a second example diode 416, a first example current limiting circuit 418, and a second example current limiting circuit 420. Further depicted in the example of FIG. 4 are the first terminal 302, the second terminal 304, and the enable signal 350 of FIG. 3.

In the illustrated example of FIG. 4, the level shifter 402 is a buffer that can be configured to translate between two different voltage domains (e.g., from a first voltage to a second voltage). For example, the level shifter 402 can translate a first signal (e.g., the enable signal 350) to a second signal (e.g., an output of the level shifter 402). In such examples, the first signal can be and/or otherwise correspond to a ground referenced enable signal (e.g., a signal having a voltage referenced to ground). In some such examples, the second signal can be and/or otherwise correspond to a signal referenced to a first voltage at the first terminal 302 or a second voltage at the second terminal 304.

In the example of FIG. 4, the reference voltage circuit 404 includes one or more diodes arranged in a serial configuration. For example, the reference voltage circuit 404 can include a diode coupled to a Zener diode in series. In the example of FIG. 4, the voltage regulation loop circuit 406 includes a first example comparator 422. In FIG. 4, the first comparator 422 is a Schmitt trigger. Alternatively, the first comparator 422 may be any other type of comparator.

In the illustrated example of FIG. 4, the first transistor 410 and the second transistor 412 are N-Channel FETs. For example, the first transistor 410 and the second transistor 412 can be N-Channel MOSFETs (e.g., Silicon N-Channel MOSFETs, SiC N-Channel MOSFETs, etc.). Alternatively, the first bootstrap circuit 232 may be implemented using P-Channel FETs for one or both of the transistors 410, 412. In the example of FIG. 4, the first transistor 410 has a first example gate terminal 410G, a first example current terminal 410D, and a second example current terminal 410S. In the example of FIG. 4, the second transistor 412 has a second example gate terminal 412G, a third example current terminal 412D, and a fourth example current terminal 412S. In FIG. 4, the first current terminal 410D and the third current terminal 412D are drain terminals (e.g., drain current terminals). In FIG. 4, the second current terminal 410S and the fourth current terminal 412S are source terminals (e.g., source current terminals).

In the illustrated example of FIG. 4, the first transistor 410 has a first size and the second transistor 412 has a second size, where a ratio of the first size to the second size is X:1 (e.g., 30:1, 40:1, etc.). Alternatively, the ratio may be any other value. For example, the size of the transistors 410, 412 can be based on a gate-oxide thickness, a conduction parameter, a channel width, a channel length, a channel width-to-length (W/L) ratio, etc., that corresponds to a pulldown strength of the transistors 410, 412. In such examples, the first size of the first transistor 410 can correspond to the first transistor 410 having a first conduction parameter, a first W/L ratio, etc., that is/are X-times greater than a second conduction parameter, a second W/L ratio, etc., of the second transistor 412. Advantageously, the resistor 424, the second diode 416, and/or the second transistor 412 can be coupled in a configuration to reduce power dissipation and current consumption of the bootstrap circuit 232 as illustrated in the example of FIG. 4.

In the illustrated example of FIG. 4, the first current limiting circuit 418 is configured to deliver a first quantity of first current in response to the first bootstrap circuit 232 being enabled. In the example of FIG. 4, the second current limiting circuit 420 is configured to deliver a second quantity of second current in response to an expiration of a time delay (e.g., a pre-determined time delay, a pre-defined time delay, etc.). In such examples, the first quantity can be greater than the second quantity. For example, the first quantity can be 200 mA, 300 mA, etc., and the second quantity can be 30 mA, 40 mA, etc. In some examples, the time delay can be 2 microseconds, 2.4 microseconds, 2.8 microseconds, etc.

In the illustrated example of FIG. 4, an input (e.g., a level shifter input) of the level shifter 402 is configured to obtain the enable signal 350 of FIG. 3. In the example of FIG. 4, an output (e.g., a level shifter output) of the level shifter 402 is coupled to a first input (e.g., a control input, a control stage input, a control stage circuit input, etc.) of the control stage circuit 408. In FIG. 4, a reference input (e.g., a control reference input, a control stage reference input, a control stage reference circuit input, etc.) of the control stage circuit 408 is coupled to the second terminal 304. In FIG. 4, an output (e.g., a control output, a control stage output, a control stage circuit output, etc.) of the control stage circuit 408 is coupled to the first gate terminal 410G and the second gate terminal 412G (e.g., coupled to a node at which the output and the gate terminals 410G. 412G are coupled to).

In the example of FIG. 4, the transistors 410, 412 are configured as source followers (e.g., common-drain amplifiers). For example, the transistors 410, 412 are coupled to the bootstrap circuit 232 in source-follower configurations (e.g., the first transistor 410 is in a source-follower configuration, the second transistor 412 is in a source-follower configuration, etc.). In FIG. 4, the gate terminals 410G, 412G operate as inputs (e.g., source-follower inputs), the source terminals 410S, 412S operate as outputs (e.g., source-follower outputs), and the drain terminals 410D, 412D are common to respective ones of the inputs and outputs. In FIG. 4, the control stage circuit 408 can control the inputs of the source followers (e.g., control the gate terminals 410G, 412G of the transistors 410, 412) to adjust the outputs of the source followers.

In other examples, the transistors 410, 412 can be bipolar junction transistors (BJTs) (e.g., NPN BJTs, PNP BJTs, etc.) configured as emitter followers (e.g., common-emitter amplifiers). For example, the transistors 410, 412 can be BJTs coupled to the bootstrap circuit 232 in emitter-follower configurations (e.g., the first transistor 410 is in an emitter-follower configuration when the first transistor 410 is a BJT, the second transistor 412 is in an emitter-follower configuration when the second transistor 412 is a BJT, etc.). In such examples, the gate terminals of the BJTs can operate as inputs (e.g., emitter-follower inputs), the emitter terminals of the BJTs can operate as outputs (e.g., emitter-follower outputs), and the collector terminals of the BJTs can be common to respective ones of the inputs and outputs.

In some examples, the control stage circuit 408 is and/or otherwise implements a buffering stage that increases a voltage of the gate terminals 410G, 412G with respect to OUTH or decreases the voltage of the gate terminals 410G, 412G with respect to OUTH. In such examples, the control stage circuit 408 can cause the source voltages to follow the gate voltages of the transistors 410, 412 with a consistent voltage difference greater than VTH of the transistors 410, 412.

In the example of FIG. 4, the control stage circuit 408 can either (1) charge a node where both the gate terminals 410G, 412G of the transistors 410, 412 are coupled, so that a voltage at the node in reference to OUTH increases, or (2) discharge the node so that the voltage at the node decreases to be approximately 0 V reference to OUTH. Accordingly, the charged voltage between the first gate terminal 410G and OUTH and/or between the second gate terminal 412G and OUTH is dependent and/or otherwise based on the negative feedback of the voltage regulation loop circuit 406, the first current limiting circuit 418, and the second current limiting circuit 420. For example, the bootstrap circuit 232 includes the control stage circuit 408 to obtain feedback (e.g., negative feedback, a feedback signal, etc.) from at least of the first current limiting circuit 418, the second current limiting circuit 420, or the voltage regulation loop circuit 406. In such examples, the feedback can be a voltage (e.g., a voltage from at least one of the first current limiting circuit 418 or the second current limiting circuit 420), a current generated by the resistor 424, a voltage across the resistor 424, a voltage difference between VBST and OUTH, etc., and/or a combination thereof.

In some examples, the control stage circuit 408 can be a buffering stage or a common-drain amplifier that is configured to turn on or off one(s) of the transistors 410, 412. For example, the control stage circuit 408 and one(s) of the transistors 410, 412 can be coupled in a current mirror configuration (e.g., a current-controlled current source configuration) to deliver current to the bootstrap capacitor 234.

In the illustrated example of FIG. 4, the second terminal 304 is coupled to an input (e.g., a negative terminal, a negative input terminal, a reference voltage circuit input, a reference voltage circuit terminal, etc.) of the reference voltage circuit 404. In FIG. 4, an output (e.g., a reference voltage circuit output) of the reference voltage circuit 404 is coupled to a second input (e.g., a second comparator input, a negative terminal, a negative input, a negative input terminal, etc.) (designated with a '−' symbol) of the first comparator 422. In FIG. 4, a first input (e.g., a first comparator input, a positive terminal, a positive input, a positive input terminal, etc.) (designated with a '+' symbol) of the first comparator 422 is coupled to the second current terminal 410S, the fourth current terminal 412S, and the first terminal 302. In the example of FIG. 4, the first input of the control stage circuit 408 is a non-inverting input and a second input of the control stage circuit 408 is an inverting input (e.g., changes a logic '0' to a logic '1', changes a logic '1' to a logic '0', etc.).

In the illustrated example of FIG. 4, an input (e.g., a current limiting circuit input) of the first current limiting circuit 418 is coupled to a first terminal (e.g., a first resistor terminal) of an example resistor 424, an input (e.g., a current limiting circuit input) of the second current limiting circuit 420, and an anode of the second diode 416. In the example of FIG. 4, a second terminal (e.g., a second resistor terminal) of the resistor 424 is coupled (e.g., configured to be coupled) to VCC (e.g., a VCC input). In FIG. 4, an output (e.g., a current limiting circuit output) of the first current limiting circuit 418 is coupled to an output of the second current limiting circuit 420, a first output (e.g., a first comparator output) of the first comparator 422, and the second input (e.g., a second control stage circuit input) of the control stage circuit 408. In FIG. 4, an anode of the first diode 414 is coupled to VCC (e.g., a VCC input), a cathode of the first diode 414 is coupled to the first current terminal 410D. In FIG. 4, a cathode of the second diode 416 is coupled to the third current terminal 412D. In FIG. 4, the bootstrap circuit 232 includes the first diode 414 and the second diode 416 to rectify a direction of the current in examples where VBST is greater than VCC.

In the illustrated example of FIG. 4, the first transistor 410 is a main transistor and the second transistor 412 is a sense transistor. The sense transistor generates a smaller current than the main transistor. Advantageously, the smaller quantity of current that the sense transistor generates enables a smaller size of the resistor 424 to be used, which reduces the die area needed for the bootstrap circuit 232 and reduces current consumption by the bootstrap circuit 232.

In the illustrated example of FIG. 4, the current (e.g., the smaller current than the current flowing through the first transistor 410) that flows through the second transistor 412 also passes through the resistor 424. In FIG. 4, the first current limiting circuit 418 and the second current limit circuit 420 are coupled to the resistor 424 and the second transistor 412 in a configuration to measure the voltage across the resistor 424. For example, the first current limiting circuit 418 can be a P-type transistor that generates current based on the voltage across a source terminal and a gate terminal of the P-type transistor. In such examples, the second current limiting circuit 420 can be an analog amplifier that compares the voltage across the resistor 424 with an internal reference. In some such examples, the bootstrap circuit 232 is configured to charge the bootstrap capacitor 234 using negative feedback control. For example, the bootstrap circuit 232 can use negative feedback control by having the P-type transistor generate current based on a voltage across a source terminal and a gate terminal of the P-type transistor. The generated current can cause the control stage circuit 408 to regulate the combined current generated by the first transistor 410 and the second transistor 412 to the first quantity of current. After a pre-determined time period, the analog amplifier generates an amplified signal so that the control stage circuit 408 regulates the combined current generated by the first transistor 410 and the second transistor 412 to the second quantity of current less than the first quantity of current.

In example operation, a first voltage at the first terminal 302 is greater than a second voltage at the second terminal 304. The first comparator 422 can assert a logic signal (e.g., a logic high signal) to the second input of the control stage circuit 408. In example operation, the level shifter 402 is configured to level shift the enable signal 350 to control operation of the control stage circuit 408. For example, in response to an assertion of the enable signal 350, the level shifter 402 can assert a level-shifted logic signal (e.g., a logic high signal generated by a current and/or voltage that corresponds to a digital 'I') to the first input of the control stage circuit 408 to trigger the control stage circuit 408 to turn on the first transistor 410 and the second transistor 412. In such examples, the level shifter 402 can turn on the current mirror circuit that includes at least one of the control stage circuit 408, the first transistor 410, or the second transistor 412. In some such examples, the level shifter 402 can turn on the current mirror by turning on a transistor included in the control stage circuit 408, which, in turn, can turn on the first transistor 410 and the second transistor 412.

In example operation, the asserted logic signal from the first comparator 422 and an asserted logic signal from the first current limiting circuit 418 can trigger the control stage circuit 408 to turn on the first transistor 410 and the second transistor 412. For example, the first transistor 410 and the second transistor 412 can conduct a first quantity of current (e.g., 200 mA, 250 mA, etc.) from VCC. In such examples, the first transistor 410 and the second transistor 412 can charge the bootstrap capacitor 234 with the first quantity of current.

In example operation, after a pre-determined or pre-defined time period (e.g., 2.0 µs, 2.4 µs, etc.), time constant, etc., has elapsed, the first current limiting circuit 418 turns off. In response to turning off the first current limiting circuit 418, the second current limiting circuit 420 turns on. In response to turning on the second current limiting circuit 420, the second current limiting circuit 420 triggers the control stage circuit 408 to cause the first transistor 410 and the second transistor 412 to conduct a second quantity of current (e.g., 30 mA, 40 mA, etc.) that is less than the first quantity of current. In such examples, the first transistor 410 and the second transistor 412 can charge the bootstrap capacitor 234 with the second quantity of current. In some such examples, the second current limiting circuit 420 is configured to deliver and/or otherwise supply (e.g., continuously supply, constantly supply, etc.) the second quantity of current to the first terminal 302 to charge the bootstrap capacitor 234. Advantageously, an output (e.g., an analog output) from the second current limiting circuit 420 can control discharge current of the transistors 410, 412 so that a first VGS of the first transistor 410 and a second VGS of the second transistor 412 are negative-feedback controlled to generate the second quantity of current.

Advantageously, the second current limiting circuit 420 can be configured to supply (e.g., continuously supply, constantly supply, etc.) the second quantity of current to the bootstrap capacitor 234 without heating up the bootstrap capacitor 234 to a heat threshold that can lead to damage of the bootstrap capacitor 234. In example operation, in response to a voltage at the second terminal 304 satisfying a voltage threshold (e.g., a voltage at the first terminal 302), the voltage regulation loop circuit 406 turns off and/or otherwise shuts down the control stage circuit 408. Advantageously, the voltage regulation loop circuit 406 can turn off the control stage circuit 408 to reduce current consumption in response to the voltage at the second terminal 304 satisfying the voltage threshold.

Figure 5:
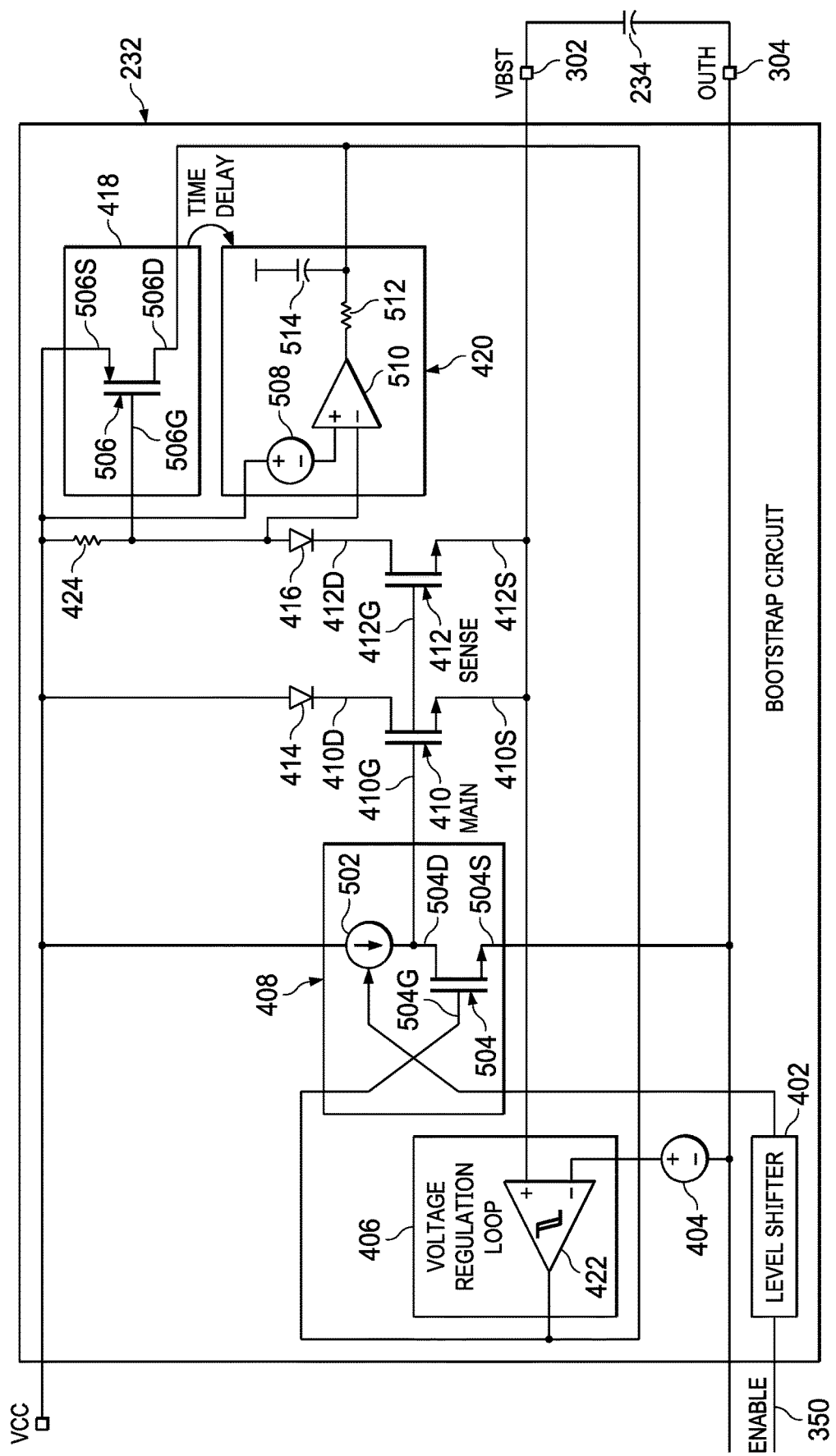
FIG. 5 is a schematic illustration of the example bootstrap circuit of FIGS. 2-4 including an implementation of the example control stage circuit, the first example current limiting circuit, and the second example current limiting circuit of FIG. 4.

FIG. 5 is a schematic illustration of an implementation of the example control stage circuit 408, the first current limiting circuit 418, and the second current limiting circuit 420 of FIG. 4. In the example of FIG. 5, the control stage circuit 408 includes an example current source 502 and a third example transistor 504.

In the example of FIG. 5, the level shifter 402 of FIG. 4 enables or disables the current source 502. In FIG. 5, the current source 502 has a control input (e.g., a current source control input), a current source input, and a current source output. For example, the output of the level shifter 402 can be transmitted to the control input to toggle the current source 502 on or off. In such examples, in response to toggling the current source 502 on, current flows from VCC to the control source input and to the third transistor 504 via the control source output.

In the illustrated example of FIG. 5, the current source 502 is a current mirror (e.g., a P-type current mirror). For example, the output of the level shifter 402 can either toggle the current mirror on to effectuate current to flow from VCC or off to prevent current from flowing from VCC. Alternatively, the current source 502 can be a resistor (e.g., a variable resistor). For example, the output of the level shifter 402 can toggle and/or otherwise adjust a resistance of the resistor to generate a voltage across the resistor to limit the current from VCC.

In the illustrated example of FIG. 5, the third transistor 504 has a third gate terminal 504G, a fifth example current terminal 504D, and a sixth example current terminal 504S. In the example of FIG. 5, the fifth current terminal 504D is a drain terminal (e.g., a drain current terminal) and the sixth current terminal 504S is a source terminal (e.g., a source current terminal). In FIG. 5, the third transistor 504 is a N-Channel transistor (e.g., an N-Channel MOSFET, a SiC N-Channel MOSFET, a Si N-Channel MOSFET, etc.).

Alternatively, the control stage circuit 408 of FIG. 5 may be implemented using a P-Channel FET or a PNP BJT in place of the third transistor 504. In some examples, by increasing the voltage at the third gate terminal 504G, the third transistor 504 increases the voltage at the gate terminals 410G, 412G, which, in turn, can increase a quantity of current flowing through the transistors 410, 412. In other examples, by decreasing the voltage at the third gate terminal 504G, the third transistor 504 decreases the voltage at the gate terminals 410G, 412G, which, in turn, can decrease a quantity of current flowing through the transistors 410, 412.

In the illustrated example of FIG. 5, the first current limiting circuit 418 includes a fourth example transistor 506 has a fourth gate terminal 506G, a seventh example current terminal 506D, and an eighth example current terminal 506S. In the example of FIG. 5, the seventh current terminal 506D is a drain terminal (e.g., a drain current terminal) and the eighth current terminal 506S is a source terminal (e.g., a source current terminal). In FIG. 5, the fourth transistor 506 is a P-Channel transistor (e.g., a P-Channel MOSFET, a SiC P-Channel MOSFET, a Si P-Channel MOSFET, etc.). Alternatively, the first current limiting circuit 418 of FIG. 5 may be implemented using an N-Channel transistor for the fourth transistor 506.

In the illustrated example of FIG. 5, the second current limiting circuit 420 includes an example voltage source 508, an example amplifier 510, a second example resistor 512, and a second example capacitor 514. In the example of FIG. 5, the voltage source 508 is an internal reference voltage (e.g., an internal reference voltage source). The voltage source 508 has a first voltage source terminal (designated with a '+' symbol) and a second voltage source terminal (designated with a '−' symbol). For example, the voltage source 508 can be configured to have a voltage drop of 0.5 V, 1.0 V, 1.5 V, etc., across the first and second voltage source terminals.

In the example of FIG. 5, the amplifier 510 has a first amplifier input (designated with a '+' symbol), a second amplifier input (designated with a '−' symbol), and an amplifier output. In FIG. 5, the amplifier 510 is an analog amplifier configured to generate an output (e.g., an amplified output, an analog output, a voltage, etc.) of any level of analog signal between the first amplifier input and the second amplifier input. For example, the voltage at the second amplifier input can correspond to and/or otherwise be based on a first voltage at the first terminal 302, a second voltage across the resistor 424, etc.

In the illustrated example of FIG. 5, the amplifier output is coupled to the second resistor 512, the second resistor 512 is coupled to the second capacitor 514, and the second capacitor 514 is coupled to VCC. In FIG. 5, the second resistor 512 and the second capacitor 514 can be coupled in a configuration to implement a buffer with a substantially large internal RC constant, where a first stage of the buffer takes a relatively long time to transition from high to low or low to high, and a second stage of the buffer generates a second output based on a first output from the first stage.

In the illustrated example of FIG. 5, the current source input is coupled to VCC, the anode of the first diode 414, the first terminal of the resistor 424, the eighth current terminal 506S, and the first voltage source terminal. In the example of FIG. 5, the current source output is coupled to the first gate terminal 410G, the second gate terminal 412G, and the fifth current terminal 504D. In FIG. 5, the control input is coupled to the output of the level shifter 402 of FIG. 4.

In the illustrated example of FIG. 5, the third gate terminal 504G is coupled to the seventh current terminal 506D, the first comparator output, and the second comparator output. In the example of FIG. 5, the sixth current terminal 504S is coupled the second terminal 304. In the illustrated example of FIG. 5, the fourth gate terminal 506G is coupled to the second terminal of the resistor 424, the anode of the second diode 416, and the second amplifier input. In the example of FIG. 5, the second voltage source terminal is coupled to the first amplifier input.

In example operation, in response to an assertion of the enable signal 350, the level shifter 402 can assert a level-shifted logic signal (e.g., a level-shifted logic high signal) to the control input of the current source 502 to turn on the current mirror that includes the first transistor 410, the second transistor 412, and the third transistor 504.

In example operation, a first voltage at the first terminal 302 is greater than a second voltage at the second terminal 304. The first comparator 422 can assert a logic signal (e.g., a logic high signal) to the third gate terminal 504G in response to the first voltage at the first comparator input being greater than the second voltage at the second comparator input.

In example operation, the fourth transistor 506 is turned on to assert a logic signal (e.g., a logic high signal) to the third gate terminal 504G in response to VCC being generated. For example, the fourth transistor 506 can turn on (e.g., turn on instantly) in response to generation of VCC because a source-to-gate voltage (VSG) of the fourth transistor 506 is greater than a threshold voltage (VTH) of the fourth transistor 506. In response to VSG of the fourth transistor 506 being greater than the VTH, the fourth transistor 506 can turn on.

In example operation, in response to the asserted logic signal from the first comparator 422 and the asserted logic signal from the fourth transistor 506, the third transistor 504 is turned on to conduct a reference current from the current source 502. In response to the third transistor 504 conducting the reference current, the first transistor 410 and the second transistor 412 can conduct a first quantity of current (e.g., 200 mA, 250 mA, etc.) from VCC. In the example of FIG. 5, the first transistor 410 and the second transistor 412 can charge the bootstrap capacitor 234 with the first quantity of current.

In example operation, the amplifier 510 generates an amplified signal of any level of analog signal between the first amplifier input and the second amplifier input. The current from the seventh current terminal 506D limits the current at the first current terminal 410D and the third current terminal 412D as the real-time negative feedback strength from the seventh current terminal 506D suppresses the gate voltage at the first gate terminal 410G and the second gate terminal 412G. This example negative feedback operation can maintain the current from the second current terminal 410S and the fourth current terminal 412S to be the first quantity of current.

After a pre-determined time period (e.g., 2.0 μs, 2.4 μs, etc.), if a stronger analog signal from the amplifier output appears at the third gate terminal 504G, the current from the first current terminal 410D and the third current terminal 412D reduces from the first quantity of current to a second quantity of current (e.g., 30 mA, 45 mA, etc.). Accordingly, the reduction in current from the first quantity to the second quantity affects the voltage across the resistor 424 to be small enough to be less than VTH of the fourth transistor 506. In response to generating the voltage across the resistor 424 to be less than VTH of the fourth transistor 506, the fourth transistor 506 turns off.

Figure 6:
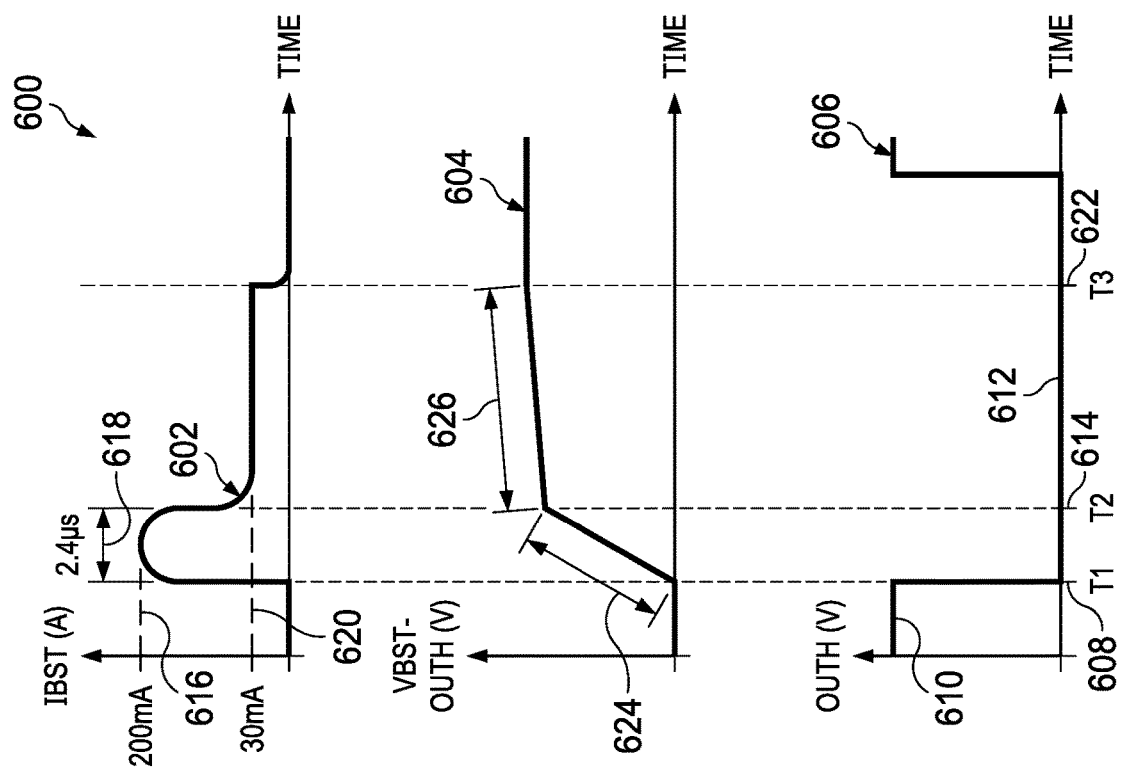
FIG. 6 is a timing diagram corresponding to example operation of the example bootstrap circuit of FIGS. 2, 3, 4, and/or 5.

FIG. 6 is an example timing diagram 600 corresponding to example operation of the first example bootstrap circuit 232 of FIGS. 2, 3, 4, and/or 5. In the timing diagram 600 of the example of FIG. 6, example waveforms 602, 604, 606 are depicted with respect to time. The waveforms 602, 604, 606 include a first example waveform 602, a second example waveform 604, and a third example waveform 606.

In the illustrated example of FIG. 6, the first waveform 602 corresponds to bootstrap current (IBST) in amperes (A). For example, IBST can correspond to current flowing to the bootstrap capacitor 234 of FIGS. 2-5. In the example of FIG. 6, the second waveform 604 corresponds to a voltage difference in volts (V) between a bootstrap voltage (VBST) and a HS output (OUTH). For example, the voltage difference can correspond to a difference between a first voltage at the first terminal 302 of FIGS. 3-5 and a second voltage at the second terminal 304 of FIGS. 3-5. In the example of FIG. 6, the third waveform 606 can correspond to the HS output (OUTH) in volts (V). For example, OUTH can correspond to the second voltage at the second terminal 304 of FIGS. 3-5.

In the example timing diagram 600 of FIG. 6, at a first example time (T1) 608, OUTH transitions from a first example voltage 610 to a second example voltage 612, where the first voltage 610 is greater than the second voltage 612. The first voltage 610 can correspond to an asserted logic signal (e.g., a logic high signal). The second voltage 612 can correspond to an unasserted logic signal (e.g., a logic low signal). For example, the first gate driver 334 of FIG. 3 can turn off the first gate driver transistor 338 of FIG. 3 to generate the second voltage 612 at the second terminal 304 of FIG. 3.

At the first time 608, in response to the enable signal 350 of FIGS. 3-5 being asserted and OUTH being less than VCC, the level shifter 402 can assert a level-shifted one of the enable signal 350 to the control stage circuit 408 and the first comparator 422 can assert a logic signal to the control stage circuit 408 to turn on the first transistor 410 of FIGS. 4-5, the second transistor 412 of FIGS. 4-5, and the third transistor 504 of FIG. 5. In response to triggering the control stage circuit 408 to turn on the first transistor 410, the second transistor 412, and the third transistor 504, the first current limiting circuit 418 of FIGS. 4-5 is triggered to charge the bootstrap capacitor 234 of FIGS. 2-5 from the first time 608 until a second example time (T2) 614 using a first example quantity of current 616. In the example of FIG. 6, the first quantity of current is 200 mA. Alternatively, any other amount, level, or quantity of current may be used for the first quantity of current 616.

In the illustrated example of FIG. 6, the second waveform 604 is increasing between the first time 608 and the second time 614 because a voltage difference between the first terminal 302 and the second terminal 304 is increasing in response to the charging of the bootstrap capacitor 234. In FIG. 6, an example time difference 618 between the first time period 608 and the second time period 614 is 2.4 µs. Alternatively, the time difference 618 may be any other period of time.

In the illustrated example of FIG. 6, in response to the time difference 618 elapsing, ending, etc., at the second time 614, the second current limiting circuit 420 of FIGS. 4-5 decreases the gate voltage at the third gate terminal 504G of FIG. 5 to reduce the charging current of the bootstrap capacitor 234 from the first quantity of current to a second example quantity of current 620. In the example of FIG. 6, the second quantity of current is 30 mA. Alternatively, any other amount, level, or quantity of current may be used for the second quantity of current 616. Advantageously, the second current limiting circuit 420 can reduce the charging current to the second quantity of current 620 to protect against a short-circuit condition in response to the first terminal 302 being shorted to another node (e.g., voltage node).

In the illustrated example of FIG. 6, the second waveform 604 is increasing between the second time 614 and a third example time 622 because the voltage difference between the first terminal 302 and the second terminal 304 is increasing in response to the charging of the bootstrap capacitor 234. In the example of FIG. 6, a first example slope (e.g., a first charging slope) 624 of the second waveform 604 is greater than a second example slope 626 of the second waveform 604. In FIG. 6, the first slope 624 corresponds to and/or otherwise is based on a first charging rate in response to the first quantity of current 616 charging the bootstrap capacitor 234. In FIG. 6, the second slope 626 corresponds to and/or otherwise is based on a second charging rate in response to the second quantity of current 616 charging the bootstrap capacitor 234. In the example of FIG. 6, the first charging rate is less than the second charging rate.

In the illustrated example of FIG. 6, at the third time 622, the voltage difference between VBST and OUTH reaches a voltage regulation loop target. For example, the first comparator 422 can de-assert a logic signal in response to a first voltage at the first terminal 302 being met by and/or is otherwise less than or equal to a second voltage at the second terminal 304.

Figure 7:
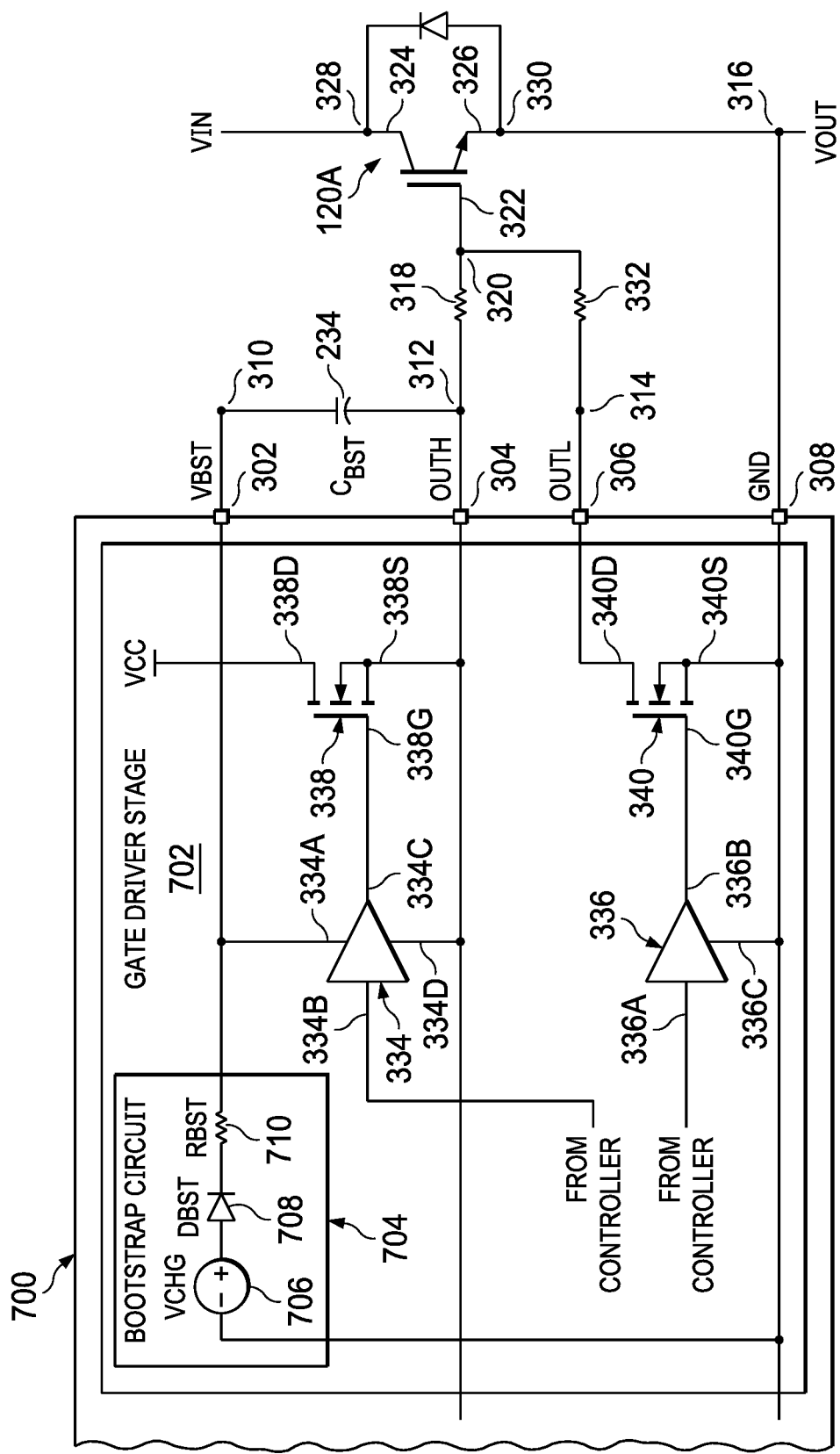
FIG. 7 is a schematic illustration of an implementation of an example gate driver integrated device including an example gate driver stage and an example bootstrap circuit.

FIG. 7 is a schematic illustration of an example gate driver integrated device 700 including a second example gate driver stage 702 and a second example bootstrap circuit 704. For example, the gate driver integrated device 700 of FIG. 7 can correspond to one or more of the gate driver integrated devices 102A-F of FIG. 1. The second gate driver stage 702 of FIG. 7 includes the first terminal 302, the second terminal 304, the third terminal 306, the fourth terminal 308, the first gate driver 334, the second gate driver 336, the first gate driver transistor 338, and the second gate driver transistor 340 of FIG. 3. Further depicted in FIG. 7 is the bootstrap capacitor 234 of FIGS. 2-5 coupled to the first terminal 302 and the second terminal 304. Also depicted in FIG. 7 is the first transistor 120A of FIG. 1 coupled to the first resistor 318 and the second resistor 332 of FIG. 3.

In FIG. 7, the second bootstrap circuit 704 includes a second example reference voltage circuit (VCHG) 706, an example bootstrap diode (DBST) 708, and an example bootstrap resistor (RBST) 710. In FIG. 7, the bootstrap resistor 710 is a current-limiting resistor. In FIG. 7, the second reference voltage circuit 706 and/or, more generally, the second bootstrap circuit 704, has a fixed voltage against the power ground. The second bootstrap circuit 704 charges the bootstrap capacitor 234 through the bootstrap diode 708 and the bootstrap resistor 710. Advantageously, the first bootstrap circuit 232 of FIGS. 2-5 improves the second bootstrap circuit 704 by having a reference voltage against the first terminal 302. For example, the first bootstrap circuit 232 can avoid overcharging the bootstrap capacitor 234 in response to OUTH undershooting below power ground by being referenced to the second terminal 304 instead of the fourth terminal 308.

Figure 8:
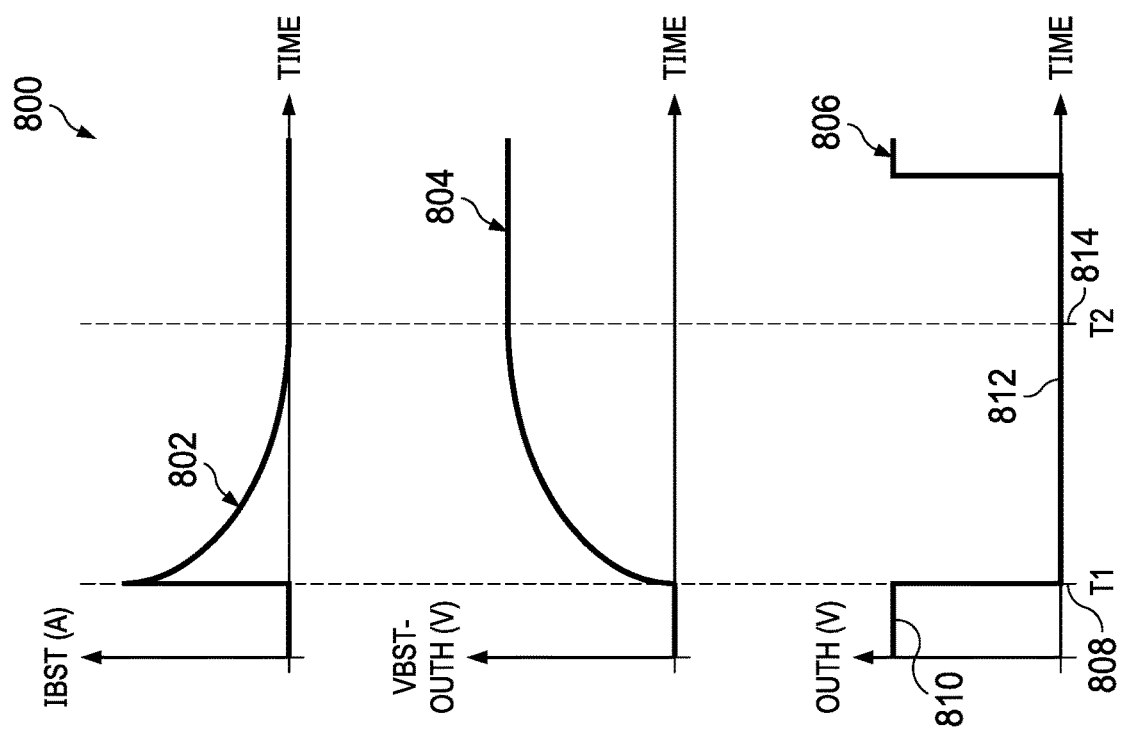
FIG. 8 is a timing diagram corresponding to example operation of the example bootstrap circuit of FIG. 7.

FIG. 8 is a timing diagram corresponding to example operation of the second bootstrap circuit 704 of FIG. 7. In the timing diagram 800 of FIG. 8, example waveforms 802, 804, 806 are depicted with respect to time. The waveforms 802, 804, 806 include a first example waveform 802, a second example waveform 804, and a third example waveform 806.

In FIG. 8, the first waveform 802 corresponds to bootstrap current (IBST) in amperes (A). For example, IBST can correspond to current flowing to the bootstrap capacitor 234 of FIG. 7. In FIG. 8, the second waveform 804 can correspond to a voltage difference in volts (V) between a bootstrap voltage (VBST) and a HS output (OUTH). For example, the voltage difference can correspond to a difference between a first voltage at the first terminal 302 of FIG. 7 and a second voltage at the second terminal 304 of FIG. 7. In FIG. 8, the third waveform 806 can correspond to the HS output (OUTH) in volts (V). For example, OUTH can correspond to the second voltage at the second terminal 304 of FIG. 7.

In the timing diagram 800 of FIG. 8, at a first time (T) 808, OUTH transitions from a first voltage 810 to a second voltage 812, where the first voltage 810 is greater than the second voltage 812. The first voltage 810 can correspond to an asserted logic signal (e.g., a logic high signal). The second voltage 812 can correspond to an unasserted logic signal (e.g., a logic low signal). For example, the first gate driver 334 of FIG. 7 can turn off the first gate driver transistor 338 of FIG. 7 to generate the second voltage 812 at the second terminal 304 of FIG. 7.

In the timing diagram 800 of FIG. 8, at the first time 808, the second bootstrap circuit 704 of FIG. 7 charges the bootstrap capacitor 234 of FIG. 7 based on a voltage generated by the second example reference voltage circuit 706 of FIG. 7. IBST decreases from the first time 808 until a second time (T2) 814 as the voltage difference between VBST and OUTH increases. In FIG. 7, IBST decreases to substantially zero at the second time 814 in response to VBST being met and/or otherwise being equal to VCHG (e.g., VBST being approximately equal to VCHG within a range of −0.05 V to 0.05 V of each other). Advantageously, the first bootstrap circuit 232 is an improvement over the second bootstrap circuit 704 because the first bootstrap circuit 232 includes the first current limiting circuit 418 of FIGS. 4-5 to charge the bootstrap capacitor 234 relatively quickly with a first quantity of current and the second current limiting circuit 420 of FIGS. 4-5 to charge the bootstrap capacitor 234 with a second quantity of current less than the first quantity of current. As depicted in FIG. 6 and FIG. 8, the second bootstrap circuit 704 cuts off the charging current at the second time 814 while the first bootstrap circuit 232 charges the bootstrap capacitor 234 from the second time 614 of FIG. 6 until at least the third time 622 of FIG. 6.

Figures 9A, 9B:
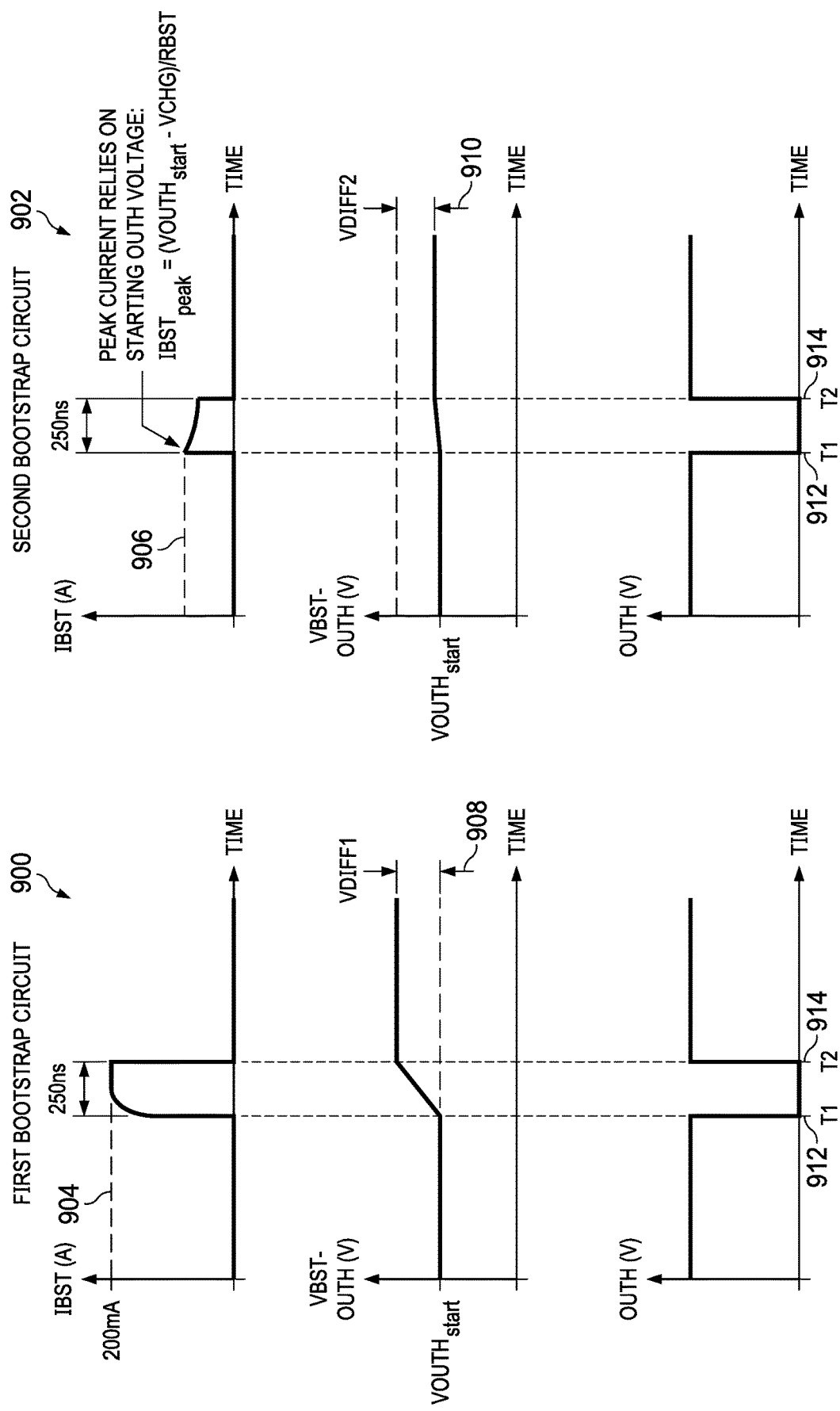
FIG. 9A is a timing diagram corresponding to example operation of the example bootstrap circuit of FIGS. 2, 3, 4, and/or 5 during a charging operation.
FIG. 9B is a timing diagram corresponding to example operation of the example bootstrap circuit of FIG. 7 during a charging operation.

FIG. 9A is a first timing diagram 900 corresponding to example operation of the first example bootstrap circuit 232 of FIGS. 2, 3, 4, and/or 5 during a charging operation. FIG. 9B is a second timing diagram 902 corresponding to example operation of the second example bootstrap circuit 704 of FIG. 7 during a charging operation. Advantageously, the first bootstrap circuit 232 improves the second bootstrap circuit 704 by charging the bootstrap capacitor 234 of FIGS. 2-5 and/or 7 with a first quantity of current 904 that is greater than a second quantity of current 906 that the second bootstrap circuit 704 uses to charge the bootstrap capacitor 234. In FIG. 9A, the first quantity of current 904 is 200 mA. Alternatively, the first quantity of current 904 may be any other value (e.g., 180 mA, 250 mA, etc.). In FIG. 9B, the second quantity of current 906 is based on a starting OUTH voltage (VOUTHSTART). For example, the second quantity of current 906 can have a peak IBST based on the example of Equation (I) below:

$$IBST_{PEAK} = \frac{(VOUTH_{START} - VCHG)}{RBST}$$

In the example of Equation (1) above, VCHG can correspond to a voltage generated by the second reference voltage circuit 706 of FIG. 7 and RBST can correspond to a resistance of the bootstrap resistor 710 of FIG. 7.

In the illustrated example of FIGS. 9A-9B, the first quantity of current 904 does not rely on the starting OUTH voltage and, thus, the first bootstrap circuit 232 can generate a greater IBST compared to the second bootstrap circuit 704. In the example of FIGS. 9A-9B, the first bootstrap circuit 232 can generate a first voltage difference (VDIFF1) 908 of VBST and OUTH that is greater than a second voltage difference (VDIFF2) 910 generated by to the second bootstrap circuit 704.

In the examples of FIGS. 9A-9B, the first time (T1) 912 of FIG. 9A occurs at the same time as the first time 912 of FIG. 9B. Alternatively, the first time 912 of FIG. 9A may be different than the first time 912 of FIG. 9B. In the examples of FIGS. 9A-9B, the second time (T2) 914 of FIG. 9A occurs at the same time as the second time 914 of FIG. 9B. Alternatively, the second time 914 of FIG. 9A may be different than the second time 914 of FIG. 9B.

Figure 10B:
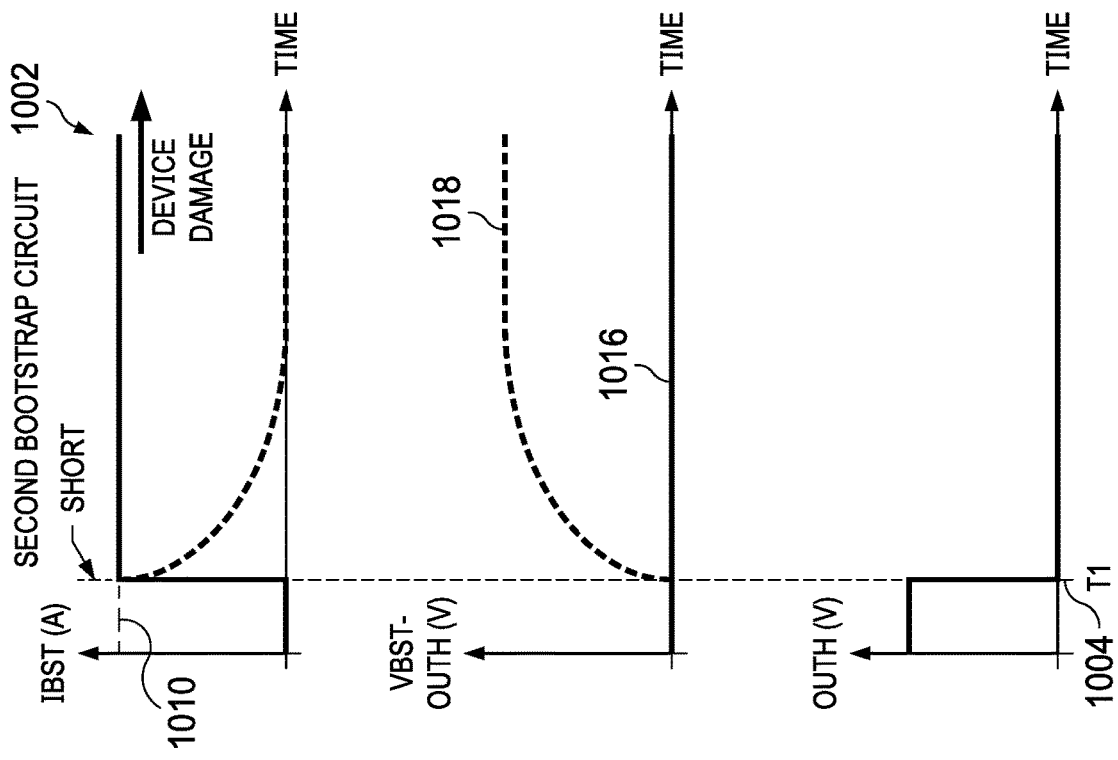
FIG. 10B is a timing diagram corresponding to example operation of the example bootstrap circuit of FIG. 7 associated with a short-circuit condition.
Figure 10A:
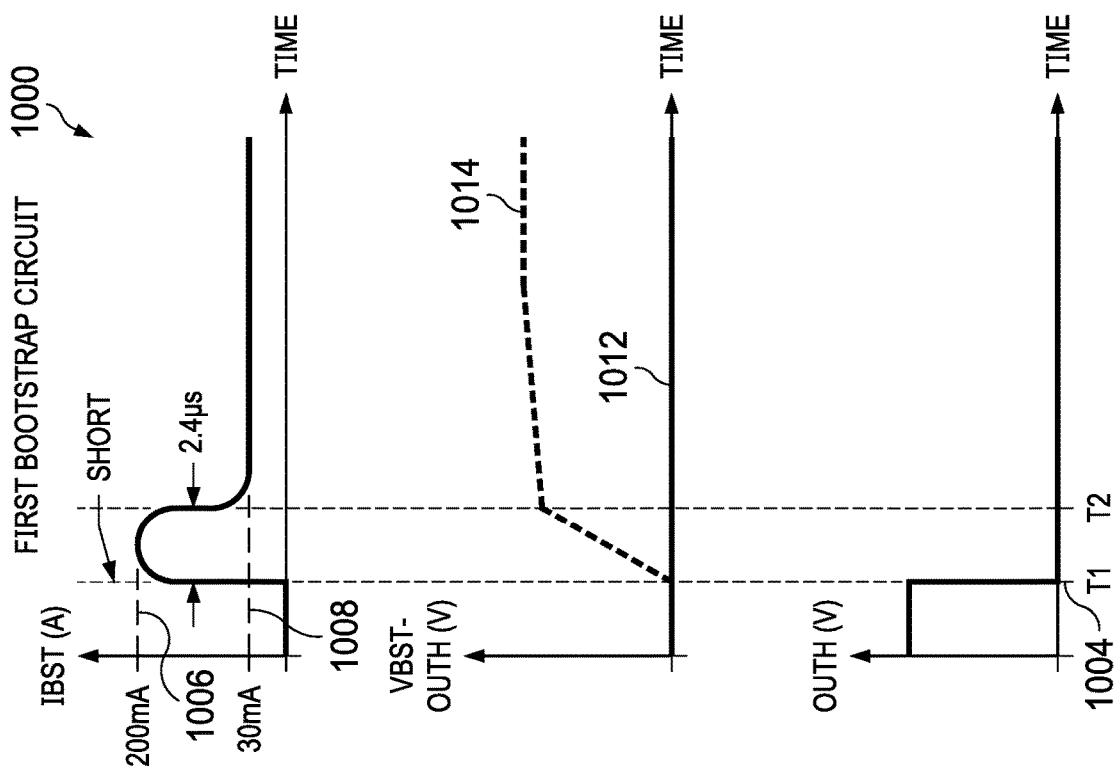
FIG. 10A is a timing diagram corresponding to example operation of the example bootstrap circuit of FIGS. 2, 3, 4, and/or 5 associated with a short-circuit condition.

FIG. 10A is a first timing diagram 1000 corresponding to example operation of the first bootstrap circuit 232 of FIGS. 2, 3, 4, and/or 5 associated with a short-circuit condition. FIG. 10B is a second timing diagram 1002 corresponding to example operation of the second bootstrap circuit 704 of FIG. 7 associated with the short-circuit condition. For example, the short-circuit condition can occur in response to a shorting of the first terminal 302 of FIGS. 3-5 and/or 7 to an unintended voltage rail, such as the fourth terminal 308 of FIGS. 3-5 and/or 7.

In the first timing diagram 1000 of FIG. 10A, at a first time (T1) 1004, the short-circuit condition occurs. In the first timing diagram 1000 of FIG. 10A, the first bootstrap circuit 232 reduces a first quantity of current 1006 to a second quantity of current 1008 in response to the short-circuit condition.

In the second timing diagram 1002 of FIG. 10B, in response to the short-circuit condition at the first time 1004, the second bootstrap circuit 704 does not reduce a third quantity of current 1010 of IBST. Advantageously, the first bootstrap circuit 232 is an improvement over the second bootstrap circuit 704 because the first bootstrap circuit 232 can prevent device damage by reducing IBST to the second quantity of current 1008 while the second bootstrap circuit 704 maintains the third quantity of current 1010 in response to the short-circuit condition at the first time 1004. Advantageously, the first bootstrap circuit 232 can prevent damage to the bootstrap capacitor 234 of FIGS. 2-5 and/or 7 and/or other components or devices coupled to or in circuit with the bootstrap capacitor 234 by reducing IBST to the second quantity of current 1008 in response to the short-circuit condition.

Further depicted in FIG. 10A are a first voltage difference waveform 1012 (represented by a solid line) in response to the short-circuit condition and a second voltage difference waveform 1014 (represented by a dotted line) in response to a short-circuit condition not occurring (e.g., normal operation of the first bootstrap circuit 232 and/or, more generally, the first gate driver stage 202).

Further depicted in FIG. 10B are a third voltage difference waveform 1016 (represented by a solid line) in response to the short-circuit condition and a second voltage difference waveform 1018 (represented by a dotted line) in response to a short-circuit condition not occurring (e.g., normal operation of the second bootstrap circuit 704 and/or, more generally, the second gate driver stage 702). In the examples of FIGS. 10A-10B, the first time 1004 of FIG. 10A occurs at the same time as the first time 1004 of FIG. 10B. Alternatively, the first time 1004 of FIG. 10A may be different than the first time 1004 of FIG. 10B.

FIG. 11A is a first timing diagram 1100 corresponding to example operation of the first bootstrap circuit 232 of FIGS. 2, 3, 4, and/or 5 associated with a gate driver output undershoot condition. FIG. 11B is a second timing diagram 1102 corresponding to example operation of the second bootstrap circuit 704 of FIG. 7 associated with the gate driver output undershoot condition. For example, the gate driver output undershoot condition can occur in response to a voltage output at the second terminal 304 of FIGS. 3-5 and/or 7 falling below power ground (e.g., a voltage at the fourth terminal 308 of FIGS. 3-5 and/or 7).

In the first timing diagram 1100 of FIG. 11A, at a first time (T1) 1104, a HS output (OUTH) corresponding to a voltage at the second terminal 304 of FIGS. 3-5 becomes negative and/or otherwise falls below power ground. Such an event can correspond to the gate driver output undershoot condition. At the first time 1104, a bootstrap current (IBST) corresponding to a current generated by the first bootstrap circuit 232 of FIGS. 2-5 to charge the bootstrap capacitor 234 of FIGS. 2-5 and/or 7 is a first quantity of current 1106. At a second time 1108, the first bootstrap circuit 232 reduces the first quantity of current 1106 to a second quantity of current 1110. Advantageously, by reducing IBST to the second quantity of current 1110 from the second time 1108 to a third time 1112, the first bootstrap circuit 232 prevents overcharging of the bootstrap capacitor 234.

In the second timing diagram 1102 of FIG. 11B, at the first time 1104, a HS output (OUTH) corresponding to a voltage at the second terminal 304 of FIG. 7 becomes negative and/or otherwise falls below power ground. Such an event can correspond to the gate driver output undershoot condition. At the first time 1104 in the second timing diagram 1102, a bootstrap current (IBST) corresponding to a current generated by the second bootstrap circuit 704 of FIG. 7 to charge the bootstrap capacitor 234 of FIG. 7 is a third quantity of current 1114. At the second time 1108 of the second timing diagram 1102, the second bootstrap circuit 704 reduces the third quantity of current 1114 to a fourth quantity of current 1116. In the examples of FIGS. 1A-11B, the fourth quantity of current 1116 is greater than the second quantity of current 1110. In the example of FIG. 11B, in response to reducing the third quantity of current 1114 to the fourth quantity of current 1116, the second bootstrap circuit 704 overcharges the bootstrap capacitor 234 by an amount quantified by an overcharge voltage difference 1118 between (1) a first voltage difference 1120 between VBST and OUTH depicted in FIG. 11A and (2) a second voltage difference 1122 between VBST and OUTH depicted in FIG. 11B.

Advantageously, by reducing IBST to the second quantity of current 1110 from the second time 1108 to the third time 1112, the first bootstrap circuit 232 prevents overcharging of the bootstrap capacitor 234 when compared to example operation of the second bootstrap circuit 704. In the examples of FIGS. 11A-11B, the first time 1104, the second time 1108, and the third time 1112 of FIG. 11A occur at the same time as the first time 1104, the second time 1108, and the third time 1112 of FIG. 11B. Alternatively, one or more of the first time 1104, the second time 1108, and/or the third time 1112 of FIG. 11A may be different than the first time 1104, the second time 1108, and/or the third time 1112 of FIG. 11B.

Figure 12:
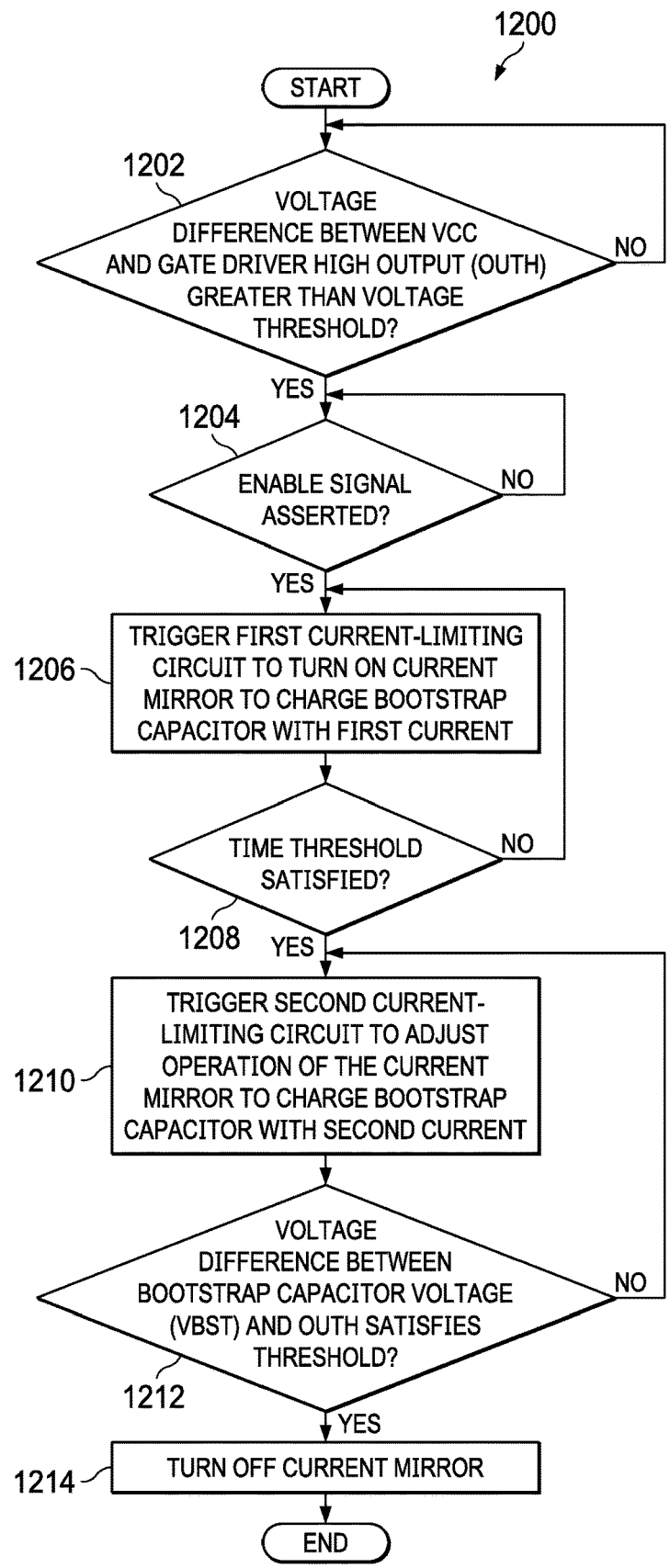
FIG. 12 is a flowchart representative of a process that may be carried out while utilizing example machine readable instructions that may be executed and/or hardware configured to implement the example bootstrap circuit of FIGS. 2, 3, 4, and/or 5, the example gate driver stage of FIG. 2, and/or, more generally, the example gate driver integrated device of FIG. 1, to bootstrap an example gate driver included in the example gate driver stage.

A flowchart representative of an example process that may be carried out while utilizing example hardware logic, example machine readable instructions (e.g., hardware readable instructions), example hardware implemented state machines, and/or any combination thereof configured to implement the first example bootstrap circuit 232 of FIGS. 2-5, the first example gate driver stage 202 of FIGS. 2-3, and/or, more generally, the first example gate driver integrated device 102A of FIG. 1, is shown in FIG. 12. The example machine readable instructions may be one or more executable programs or portion(s) of an executable program for execution by programmable processor(s), programmable controller(s), GPU(s), DSP(s), ASIC(s), PLD(s), and/or FPLD(s). The program may be embodied in software stored on a non-transitory computer readable storage medium such as a non-volatile memory, volatile memory, etc., but the entire program and/or parts thereof could alternatively be executed by any other device (e.g., programmable device) and/or embodied in firmware or dedicated hardware. Further, although the example program is described with reference to the flowchart illustrated in FIG. 12, many other methods of implementing the first example bootstrap circuit 232 of FIGS. 2-5, the first example gate driver stage 202 of FIGS. 2-3, and/or, more generally, the first example gate driver integrated device 102A of FIG. 1, may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices. The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example process of FIG. 12 may be implemented using executable instructions (e.g., computer, machine, and/or hardware readable instructions) stored on a non-transitory computer and/or machine readable medium such as a flash memory, a read-only memory, a cache, a random-access memory, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory machine readable medium, and/or non-transitory hardware readable medium is/are expressly defined to include any type of computer, machine, and/or hardware readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "/or" when used, for example, in a form such as A, B, and/or C refers to any combination or subset of A. B. C such as (1) A alone, (2) B alone, (3) C alone, (4) A with B, (5) A with C, (6) B with C. and (7) A with B and with C. As used herein in the context of describing structures, components, items, objects and/or things, the phrase "at least one of A and B" is intended to refer to implementations including any of (1) at least one A. (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B. and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 12 is a flowchart representative of an example process 1200 that may be carried out while utilizing example machine readable instructions that may be executed and/or example hardware configured to implement the first example bootstrap circuit 232 of FIGS. 2-5, the first example gate driver stage 202, and/or, more generally, the first example gate driver integrated device 102A of FIG. 1, to bootstrap the first example gate driver 334 of FIG. 3. The example process 1200 of the example of FIG. 12 begins at block 1202, at which the first bootstrap circuit 232 and/or, more generally, the first gate driver stage 202, determine whether a voltage difference between VCC and a gate driver high output (OUTH) is greater than a voltage threshold (e.g., 2 V, 2.2 V, 2.5 V, etc.).

If, at block 1202, the first bootstrap circuit 232 and/or, more generally, the first gate driver stage 202, determine that the voltage difference between VCC and OUTH is not greater than the voltage threshold, control waits until the voltage difference is greater than the voltage threshold. If, at block 1202, the first bootstrap circuit 232 and/or, more generally, the first gate driver stage 202, determine that the voltage difference is greater than the voltage threshold, then, at block 1204, the first bootstrap circuit 232 and/or, more generally, the first gate driver stage 202, determine whether an enable signal has been asserted. For example, the level shifter 402 (FIGS. 4-5) can determine that the enable signal 350 (FIGS. 3-5) has been asserted.

If, at block 1204, the first bootstrap circuit 232 and/or the first gate driver stage 202 determine that the enable signal not been asserted, control waits at block 1202 for an assertion of the enable signal. If, at block 1204, the first bootstrap circuit 232 and/or the first gate driver stage 202 determine that the enable signal has been asserted, then, at block 1206, the first bootstrap circuit 232 and/or the first gate driver stage 202 trigger a first current-limiting circuit to turn on a current mirror to charge a bootstrap capacitor with a first current. For example, in response to OUTH being lower than VCC and in response to the enable signal 350 being asserted, the first current limiting circuit 418 is triggered to turn on the current mirror that includes the control stage circuit 408 (FIGS. 4-5), the first transistor 410 (FIGS. 4-5), and the second transistor 412 (FIGS. 4-5). In response to turning on the current mirror, the first transistor 410 and the second transistor 412 can deliver a first quantity of current to the bootstrap capacitor 234 to charge the bootstrap capacitor 234 to a voltage above VCC.

At block 1208, the first bootstrap circuit 232 and/or the first gate driver stage 202 determine whether a time threshold has been satisfied. For example, in response to an expiration of a time delay (e.g., a pre-determined time delay of 2.4 μs, 3.0 μs, etc.), the second current limiting circuit 420 (FIGS. 4-5) can be invoked to trigger the current mirror to reduce current being delivered to the bootstrap capacitor 234 from the first quantity of current to a second quantity of current.

If, at block 1208, the first bootstrap circuit 232 and/or the first gate driver stage 202 determine that the time threshold has not been satisfied, control returns to block 1204 to trigger the first current-limiting circuit to turn on the current mirror to charge the bootstrap capacitor with the first current. If, at block 1208, the first bootstrap circuit 232 and/or the first gate driver stage 202 determine that the time threshold has been met and/or otherwise satisfied, then, at block 1210, the first bootstrap circuit 232 and/or the first gate driver stage 202 trigger a second current-limiting circuit to adjust operation of the current mirror to charge the bootstrap capacitor with second current. For example, the second current limiting circuit 420 can be invoked to trigger the current mirror to reduce current being delivered to the bootstrap capacitor 234 from the first quantity of current to the second quantity of current.

At block 1212, the first bootstrap circuit 232 and/or the first gate driver stage 202 determine whether a voltage difference between a bootstrap capacitor voltage (VBST) and OUTH satisfies a threshold. For example, the voltage regulation loop circuit 406 (FIGS. 4-5) can de-assert a logic signal in response to a first voltage at the first terminal 302 being less than a second voltage at the second terminal 304. In such examples, the second voltage can meet and/or otherwise satisfy the first voltage in response to the second voltage being greater than the first voltage.

If, at block 1212, the first bootstrap circuit 232 and/or the first gate driver stage 202 determine that the voltage difference between VBST and OUTH does not satisfy the threshold, control returns to block 1210 to trigger the second current-limiting circuit to adjust operation of the current mirror to charge the bootstrap capacitor with the second current. If, at block 1212, the first bootstrap circuit 232 and/or the first gate driver stage 202 determine that the voltage difference between VBST and OUTH satisfies the threshold, then, at block 1214, the first bootstrap circuit 232 and/or the first gate driver stage 202 turn off the current mirror. For example, voltage regulation loop circuit 406 can de-assert the logic signal to trigger the control stage circuit 408 to turn off the first transistor 410 and the second transistor 412. In response to turning off the current mirror at block 1214, the example process 1200 of FIG. 12 concludes.

From the foregoing, it will be appreciated that example systems, methods, apparatus, and articles of manufacture associated with gate driver bootstrap circuits have been disclosed that improve power efficiency, reliability, and safety of high-voltage and/or high-current power devices while reducing die area of the power devices. The example systems, methods, apparatus, and articles of manufacture disclosed herein avoid overcharging of bootstrap capacitors in response to a gate driver overshoot condition. The example systems, methods, apparatus, and articles of manufacture disclosed herein reduce and/or otherwise eliminate device damage in response to a short-circuit condition. The example systems, methods, apparatus, and articles of manufacture disclosed herein can implement a relatively fast charging of a bootstrap capacitor against relatively short negative pulses (e.g., negative pulses of 250 ns). The example systems, methods, apparatus, and articles of manufacture disclosed herein can reduce power consumption when not in use by example power conversion systems.

Example methods, apparatus, systems, and articles of manufacture for gate driver bootstrap circuits are disclosed herein.

Further examples and combinations thereof include the following:

Example 1 includes a gate driver stage comprising a first terminal and a second terminal, the first terminal to be coupled to a capacitor, the capacitor and the second terminal to be coupled to a gate terminal of a power transistor, a gate driver coupled to the first terminal and the second terminal, and a bootstrap circuit coupled to the first terminal, the second terminal, and the gate driver, the bootstrap circuit including a control stage circuit having an output and a first transistor having a first gate terminal and a first current terminal, the first gate terminal coupled to the output, the first current terminal coupled to the first terminal.

Example 2 includes the gate driver stage of example 1, wherein the bootstrap circuit is configured to increase a first voltage at the first terminal to a second voltage until a voltage regulation loop circuit determines that the first voltage satisfies a voltage threshold, the second voltage referenced to a third voltage at the second terminal.

Example 3 includes the gate driver of example 2, wherein the bootstrap circuit includes a second transistor having a second gate terminal and a second current terminal, the second gate terminal coupled to the output, the second current terminal coupled to the first terminal, the first transistor and the second transistor in either a source-follower configuration or an emitter-follower configuration to increase the first voltage to the second voltage.

Example 4 includes the gate driver of example 3, wherein the first transistor and the second transistor are field-effect transistors in the source-follower configuration, the first current terminal and the second current terminal are source terminals, and the control stage circuit includes a third transistor having a third current terminal and a fourth current terminal, the third current terminal coupled to the first gate terminal and the second gate terminal, the fourth current terminal coupled to the second terminal.

Example 5 includes the gate driver of example 3, wherein the first transistor and the second transistor are bipolar junction transistors in the emitter-follower configuration, the first current terminal and the second current terminal are emitter terminals, and the control stage circuit includes a third transistor having a third current terminal and a fourth current terminal, the third current terminal coupled to the first gate terminal and the second gate terminal, the fourth current terminal coupled to the second terminal.

Example 6 includes the gate driver of example 1, wherein the bootstrap circuit includes a diode to rectify a direction of current to the first terminal in response to a first voltage at the first terminal is greater than a voltage input.

Example 7 includes the gate driver of example 1, wherein the bootstrap circuit includes a control stage circuit that obtains a feedback signal from at least of a first current limiting circuit, a second current limiting circuit, or a voltage regulation loop circuit.

Example 8 includes the gate driver of example 7, wherein the control stage circuit includes a transistor having a gate terminal, and the control stage circuit is a buffering stage coupled to the transistor, the buffering stage to drive the gate terminal to have a first voltage that is greater or lesser than a second voltage at the second terminal.

Example 9 includes the gate driver of example 1, wherein the bootstrap circuit includes a resistor, a current limiting circuit having a first input and a first output, the first input coupled to the resistor, a transistor having a gate terminal, a first current terminal, and a second current terminal, the first current terminal coupled to a voltage input, the second current terminal coupled to the first terminal, and a control stage circuit having a control input, a reference input, and a control output, the control input coupled to the first output, the reference input coupled to the second terminal, the control output coupled to the gate terminal.

Example 10 includes the gate driver of example 9, wherein the current limiting circuit is a first current limiting circuit, and the bootstrap circuit includes a second current limiting circuit having a second input and a second output, the second input coupled to the resistor and the first input, the second output coupled to the control input.

Example 11 includes the gate driver of example 10, wherein the first current limiting circuit and the second current limiting circuit are configured to measure a voltage across the resistor and compare the voltage to a voltage threshold.

Example 12 includes the gate driver of example 9, wherein the transistor is a first transistor, the gate terminal is a first gate terminal, and further including a diode having an anode and a cathode, the anode coupled to the resistor and the first input, and a second transistor having a second gate terminal, a third current terminal, and a fourth current terminal, the second gate terminal coupled to the first gate terminal and the control output, the third current terminal coupled to the cathode, the fourth current terminal coupled to the first terminal.

Example 13 includes the gate driver of example 12, wherein the first transistor has a first size and the second transistor has a second size less than the first size, the resistor coupled to the second transistor in a configuration to reduce power dissipation and current consumption of the bootstrap circuit.

Example 14 includes the gate driver of example 1, wherein the bootstrap circuit includes a control stage circuit and a level shifter coupled to the control stage circuit, the level shifter to a first signal to a second signal, the first signal corresponding to a ground referenced enable signal, the second signal corresponding to a signal referenced to a first voltage at the first terminal or a second voltage at the second terminal.

Example 15 includes a bootstrap circuit comprising a first current limiting circuit having a first output, a second current limiting circuit having a second output, a control stage circuit having a first input, a second input, and a third output, the first input coupled to the first output and the second output, a voltage regulation loop circuit having a third input, a fourth input, and a fourth output, the fourth output coupled to the first input, and a transistor having a gate terminal and a current terminal, the gate terminal coupled to the third output, the current terminal coupled to the third input.

Example 16 includes the bootstrap circuit of example 15, wherein the third input and the current terminal are to be coupled to a capacitor.

Example 17 includes the bootstrap circuit of example 15, wherein the gate terminal is a first gate terminal, the current terminal is a first current terminal, the second current limiting circuit has a fifth input, and the first current limiting circuit includes a P-Channel field-effect transistor having a second gate terminal and a second current terminal, the second gate terminal coupled to the fifth input, the second current terminal coupled to the first input.

Example 18 includes the bootstrap circuit of example 15, wherein the second output is an amplifier output, and the second current limiting circuit includes a voltage source and an amplifier, the amplifier having a first amplifier input, a second amplifier input, and the amplifier output, the voltage source coupled to the first amplifier input, the amplifier output coupled to the first input.

Example 19 includes the bootstrap circuit of example 18, wherein the first current limiting circuit has a fifth input, the transistor is a first transistor, the gate terminal is a first gate terminal, the current terminal is a first current terminal, and further including a diode having an anode and a cathode, the anode coupled to the second amplifier input and the fifth input, and a second transistor having a second gate terminal, a second current terminal, and a third current terminal, the second gate terminal coupled to the third output, the second current terminal coupled to the cathode, the third current terminal coupled to the first current terminal, and the third input.

Example 20 includes the bootstrap circuit of example 15, wherein the transistor is a first transistor, the gate terminal is a first gate terminal, the current terminal is a first current terminal, and further including a second transistor having a second gate terminal and a second current terminal, the second gate terminal coupled to the third output, the second current terminal coupled to the first current terminal, and the third input.

Example 21 includes the bootstrap circuit of example 15, further including a level shifter having a level shifter input and a level shifter output, the level shifter output coupled to the second input.

Example 22 includes the bootstrap circuit of example 15, further including a reference voltage circuit having a reference voltage circuit input and a reference voltage circuit output, the reference voltage circuit input coupled to the fourth input, the reference voltage circuit input to be coupled to a capacitor.

Example 23 includes a gate driver stage comprising a first terminal, a second terminal, a third terminal, and a fourth terminal, the first terminal, the second terminal, and the third terminal to be coupled to a gate terminal of a transistor, the fourth terminal to be coupled to a current terminal of the transistor, a first gate driver coupled to the first terminal and the second terminal, the first gate driver configured to turn on the transistor, a second gate driver coupled to the third terminal and the fourth terminal, the second gate driver configured to turn off the transistor, and a bootstrap circuit coupled to the first terminal, the second terminal, and the first gate driver.

Example 24 includes the gate driver stage of example 23, wherein the first terminal is to be coupled to a first capacitor terminal of a capacitor, the second terminal is to be coupled to a first resistor terminal of a resistor and a second capacitor terminal of the capacitor, and a second resistor terminal of the resistor to be coupled to the gate terminal.

Example 25 includes the gate driver stage of example 23, further including a second transistor to have a threshold voltage, the second transistor coupled to an output of the first gate driver, and wherein the bootstrap circuit is configured to generate a voltage across the first gate driver to cause the first gate driver to generate an output voltage greater than the threshold voltage, the second transistor to turn on in response to the output voltage being greater than the threshold voltage.

Example 26 includes the gate driver stage of example 23, wherein the transistor is a first transistor, the gate terminal is a first gate terminal, and the bootstrap circuit includes a diode having an anode and a cathode, a first current limiting circuit having a first current limiting circuit input and a first current limiting circuit output, the first current limiting circuit input coupled to the anode, a second current limiting circuit having a second current limiting circuit input and a second current limiting circuit output, the second current limiting circuit input coupled to the anode, a second transistor having a second gate terminal, a first current terminal, and a second current terminal, the second current terminal coupled to the first terminal, a third transistor having a third gate terminal, a third current terminal, and a fourth current terminal, the fourth current terminal coupled to the second current terminal and the first terminal, the third current terminal coupled to the cathode, and a control stage circuit having a control input, a control reference input, and a control output, the control input coupled to the first current limiting circuit output and the second current limiting circuit output, the control reference input coupled to the second terminal, the control output coupled to the second gate terminal and the third gate terminal.

Example 27 includes the gate driver stage of example 26, wherein the control input is a first control input, the control stage circuit has a second control input, and further including a level shifter having a level shifter output coupled to the second control input, a reference voltage circuit having a first reference voltage circuit terminal and a second reference voltage circuit terminal, the second reference voltage circuit terminal coupled to the second terminal, and a comparator having a first comparator input, a second comparator input, and a comparator output, the first comparator input coupled to the second current terminal, the fourth current terminal, and the first terminal, the second comparator input coupled to the first reference voltage circuit terminal, the comparator output coupled to the first control input, the first current limiting circuit output, and the second current limiting circuit output.

Example 28 includes the gate driver stage of example 27, wherein the diode is a first diode, and the reference voltage circuit includes a Zener diode coupled to a second diode.

Example 29 includes the gate driver stage of example 26, wherein the first current limiting circuit includes a fourth transistor having a fourth gate terminal, a fifth current terminal, and a sixth current terminal, the fourth gate terminal coupled to the anode, and the second current limiting circuit includes a voltage source having a first voltage source terminal and a second voltage source terminal, and an amplifier having a first amplifier input, a second amplifier input, and an amplifier output, the first amplifier input coupled to the second voltage source terminal, the second amplifier input coupled to the anode, and the amplifier output coupled to the sixth current terminal and the control input.

Example 30 includes the gate driver stage of example 26, further including a level shifter, and wherein the control stage circuit includes a current source coupled to the level shifter, and a fourth transistor having a fourth gate terminal, a fifth current terminal, and a sixth current terminal, the fourth gate terminal coupled to the second current limiting circuit output, the fifth current terminal coupled to the current source, the first gate terminal, and the second gate terminal, the sixth current terminal coupled to the second terminal.

Example 31 includes a gate driver integrated device comprising a first terminal to be coupled to a capacitor, a second terminal to be coupled to a gate terminal of a transistor, a gate driver stage coupled to the first terminal and the second terminal, the gate driver stage including a gate driver configured to turn on the transistor, and a bootstrap circuit coupled to the first terminal, the second terminal, and the gate driver.

Example 32 includes the gate driver integrated device of example 31, wherein the transistor is a Silicon Carbide transistor.

Example 33 includes the gate driver integrated device of example 31, wherein the gate driver integrated device is included in a traction inverter of an electric vehicle, and the transistor is coupled to a motor of the electric vehicle.

Example 34 includes the gate driver integrated device of example 31, wherein the transistor is a first transistor, the gate terminal is a first gate terminal, and the bootstrap circuit includes a diode having an anode and a cathode, a first current limiting circuit having a first current limiting circuit input and a first current limiting circuit output, the first current limiting circuit input coupled to the anode, a second current limiting circuit having a second current limiting circuit input and a second current limiting circuit output, the second current limiting circuit input coupled to the anode, a second transistor having a second gate terminal, a first current terminal, and a second current terminal, the second current terminal coupled to the first terminal, a third transistor having a third gate terminal, a third current terminal, and a fourth current terminal, the fourth current terminal coupled to the second current terminal and the first terminal, the third current terminal coupled to the cathode, and a control stage circuit having a control input, a control reference input, and a control output, the control input coupled to the first current limiting circuit output and the second current limiting circuit output, the control reference input coupled to the second terminal, the control output coupled to the second gate terminal and the third gate terminal.

Although certain example systems, methods, apparatus and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A gate driver stage comprising:
   a first terminal and a second terminal, the first terminal coupled to a capacitor, the capacitor and the second terminal coupled to a gate terminal of a power transistor;
   a gate driver coupled to the first terminal and the second terminal; and
   a bootstrap circuit coupled to the first terminal, the second terminal, and the gate driver, the bootstrap circuit including:
      a control stage circuit having an output; and
      a first transistor having a first gate terminal and a first current terminal, the first gate terminal coupled to the output, the first current terminal coupled to the first terminal.

2. The gate driver stage of claim 1, wherein the bootstrap circuit is configured to increase a first voltage at the first terminal to a second voltage until a voltage regulation loop circuit determines that the first voltage is greater than a voltage threshold.

3. The gate driver of claim 2, wherein the bootstrap circuit includes a second transistor having a second gate terminal and a second current terminal, the second gate terminal coupled to the output, the second current terminal coupled to the first terminal, the first transistor and the second transistor in either a source-follower configuration or an emitter-follower configuration to increase the first voltage to the second voltage.

4. The gate driver of claim 3, wherein the first transistor and the second transistor are field-effect transistors in the source-follower configuration, the first current terminal and the second current terminal are source terminals, and the control stage circuit includes a third transistor having a third current terminal and a fourth current terminal, the third current terminal coupled to the first gate terminal and the second gate terminal, the fourth current terminal coupled to the second terminal.

5. The gate driver of claim 3, wherein the first transistor and the second transistor are bipolar junction transistors in the emitter-follower configuration, the first current terminal and the second current terminal are emitter terminals, and the control stage circuit includes a third transistor having a third current terminal and a fourth current terminal, the third current terminal coupled to the first gate terminal and the second gate terminal, the fourth current terminal coupled to the second terminal.

6. The gate driver of claim 1, wherein the bootstrap circuit includes a diode to rectify a direction of current to the first terminal in response to a first voltage at the first terminal is greater than a voltage input.

7. The gate driver of claim 1, wherein the bootstrap circuit includes a control stage circuit that obtains a feedback signal from at least one of a current limiting circuit, or a voltage regulation loop circuit.

8. The gate driver of claim 7, wherein the control stage circuit includes a transistor having a gate terminal, and the control stage circuit is a buffering stage coupled to the transistor, the buffering stage to drive the gate terminal to have a first voltage that is greater or lesser than a second voltage at the second terminal.

9. The gate driver of claim 1, wherein the bootstrap circuit includes:
a resistor;
a current limiting circuit having a first input and a first output, the first input coupled to the resistor;
a transistor having a gate terminal, a first current terminal, and a second current terminal, the first current terminal coupled to a voltage input, the second current terminal coupled to the first terminal; and
a control stage circuit having a control input, a reference input, and a control output, the control input coupled to the first output, the reference input coupled to the second terminal, the control output coupled to the gate terminal.

10. The gate driver of claim 9, wherein the current limiting circuit is a first current limiting circuit, and the bootstrap circuit includes a second current limiting circuit having a second input and a second output, the second input coupled to the resistor and the first input, the second output coupled to the control input.

11. The gate driver of claim 10, wherein the first current limiting circuit and the second current limiting circuit are configured to measure a voltage across the resistor and compare the voltage to a voltage threshold.

12. The gate driver of claim 9, wherein the transistor is a first transistor, the gate terminal is a first gate terminal, and further including:
a diode having an anode and a cathode, the anode coupled to the resistor and the first input; and
a second transistor having a second gate terminal, a third current terminal, and a fourth current terminal, the second gate terminal coupled to the first gate terminal and the control output, the third current terminal coupled to the cathode, the fourth current terminal coupled to the first terminal.

13. The gate driver of claim 12, wherein the first transistor has a first size and the second transistor has a second size less than the first size, the resistor coupled to the second transistor in a configuration to reduce power dissipation and current consumption of the bootstrap circuit.

14. The gate driver of claim 1, wherein the bootstrap circuit includes a control stage circuit and a level shifter coupled to the control stage circuit, the level shifter to a first signal to a second signal, the first signal corresponding to a ground referenced enable signal, the second signal corresponding to a signal referenced to a first voltage at the first terminal or a second voltage at the second terminal.

15. A bootstrap circuit comprising:
a first current limiting circuit having a first output;
a second current limiting circuit having a second output;
a control stage circuit having a first input, a second input, and a third output, the first input coupled to the first output and the second output;
a voltage regulation loop circuit having a third input, a fourth input, and a fourth output, the fourth output coupled to the first input; and
a transistor having a gate terminal and a current terminal, the gate terminal coupled to the third output, the current terminal coupled to the third input.

16. The bootstrap circuit of claim 15, wherein the third input and the current terminal are to be coupled to a capacitor.

17. The bootstrap circuit of claim 15, wherein the gate terminal is a first gate terminal, the current terminal is a first current terminal, the second current limiting circuit has a fifth input, and the first current limiting circuit includes a P-Channel field-effect transistor having a second gate terminal and a second current terminal, the second gate terminal coupled to the fifth input, the second current terminal coupled to the first input.

18. The bootstrap circuit of claim 15, wherein the second output is an amplifier output, and the second current limiting circuit includes a voltage source and an amplifier, the amplifier having a first amplifier input, a second amplifier input, and the amplifier output, the voltage source coupled to the first amplifier input, the amplifier output coupled to the first input.

19. The bootstrap circuit of claim 18, wherein the first current limiting circuit has a fifth input, the transistor is a first transistor, the gate terminal is a first gate terminal, the current terminal is a first current terminal, and further including:
a diode having an anode and a cathode, the anode coupled to the second amplifier input and the fifth input; and
a second transistor having a second gate terminal, a second current terminal, and a third current terminal, the second gate terminal coupled to the third output, the second current terminal coupled to the cathode, the third current terminal coupled to the first current terminal, and the third input.

20. The bootstrap circuit of claim 15, wherein the transistor is a first transistor, the gate terminal is a first gate terminal, the current terminal is a first current terminal, and further including:
a second transistor having a second gate terminal and a second current terminal, the second gate terminal coupled to the third output, the second current terminal coupled to the first current terminal, and the third input.

21. The bootstrap circuit of claim 15, further including a level shifter having a level shifter input and a level shifter output, the level shifter output coupled to the second input.

22. The bootstrap circuit of claim 15, further including a reference voltage circuit having a reference voltage circuit input and a reference voltage circuit output, the reference voltage circuit input coupled to the fourth input, the reference voltage circuit input to be coupled to a capacitor.

23. A gate driver stage comprising:
a first terminal, a second terminal, a third terminal, and a fourth terminal, each representing a distinct node, the first terminal, the second terminal, and the third terminal coupled to a gate terminal of a transistor, the fourth terminal coupled to a current terminal of the transistor;
a first gate driver coupled to the first terminal and the second terminal, the first gate driver configured to turn on the transistor;
a second gate driver coupled to the third terminal and the fourth terminal, the second gate driver configured to turn off the transistor; and
a bootstrap circuit coupled to the first terminal, the second terminal, and the first gate driver.

24. The gate driver stage of claim 23, wherein the first terminal is to be coupled to a first capacitor terminal of a capacitor, the second terminal is to be coupled to a first resistor terminal of a resistor and a second capacitor terminal of the capacitor, and a second resistor terminal of the resistor to be coupled to the gate terminal.

25. The gate driver stage of claim 23, further including:
a second transistor to have a threshold voltage, the second transistor coupled to an output of the first gate driver; and wherein
the bootstrap circuit is configured to generate a voltage across the first gate driver to cause the first gate driver to generate an output voltage greater than the threshold voltage, the second transistor to turn on in response to the output voltage being greater than the threshold voltage.

26. The gate driver stage of claim 23, wherein the transistor is a first transistor, the gate terminal is a first gate terminal, and the bootstrap circuit includes:
a diode having an anode and a cathode;
a first current limiting circuit having a first current limiting circuit input and a first current limiting circuit output, the first current limiting circuit input coupled to the anode;
a second current limiting circuit having a second current limiting circuit input and a second current limiting circuit output, the second current limiting circuit input coupled to the anode;
a second transistor having a second gate terminal, a first current terminal, and a second current terminal, the second current terminal coupled to the first terminal;
a third transistor having a third gate terminal, a third current terminal, and a fourth current terminal, the fourth current terminal coupled to the second current terminal and the first terminal, the third current terminal coupled to the cathode; and
a control stage circuit having a control input, a control reference input, and a control output, the control input coupled to the first current limiting circuit output and the second current limiting circuit output, the control reference input coupled to the second terminal, the control output coupled to the second gate terminal and the third gate terminal.

27. The gate driver stage of claim 26, wherein the control input is a first control input, the control stage circuit has a second control input, and further including:
a level shifter having a level shifter output coupled to the second control input;
a reference voltage circuit having a first reference voltage circuit terminal and a second reference voltage circuit terminal, the second reference voltage circuit terminal coupled to the second terminal; and
a comparator having a first comparator input, a second comparator input, and a comparator output, the first comparator input coupled to the second current terminal, the fourth current terminal, and the first terminal, the second comparator input coupled to the first reference voltage circuit terminal, the comparator output coupled to the first control input, the first current limiting circuit output, and the second current limiting circuit output.

28. The gate driver stage of claim 27, wherein the diode is a first diode, and the reference voltage circuit includes a Zener diode coupled to a second diode.

29. The gate driver stage of claim 26, wherein:
the first current limiting circuit includes:
a fourth transistor having a fourth gate terminal, a fifth current terminal, and a sixth current terminal, the fourth gate terminal coupled to the anode; and
the second current limiting circuit includes:
a voltage source having a first voltage source terminal and a second voltage source terminal; and
an amplifier having a first amplifier input, a second amplifier input, and an amplifier output, the first amplifier input coupled to the second voltage source terminal, the second amplifier input coupled to the anode, and the amplifier output coupled to the sixth current terminal and the control input.

30. The gate driver stage of claim 26, further including a level shifter, and wherein the control stage circuit includes:
a current source coupled to the level shifter; and
a fourth transistor having a fourth gate terminal, a fifth current terminal, and a sixth current terminal, the fourth gate terminal coupled to the second current limiting circuit output, the fifth current terminal coupled to the current source, the first gate terminal, and the second gate terminal, the sixth current terminal coupled to the second terminal.

31. A gate driver integrated device comprising:
a first terminal coupled to a capacitor;
a second terminal coupled to a gate terminal of a transistor;
a gate driver stage coupled to the first terminal and the second terminal, the gate driver stage including:
a gate driver configured to turn on the transistor; and
a bootstrap circuit coupled to the first terminal, the second terminal, and the gate driver, the bootstrap circuit including a control stage circuit coupled to the second terminal and a current limiting circuit coupled to the control stage circuit.

32. The gate driver integrated device of claim 31, wherein the transistor is a Silicon Carbide transistor.

33. The gate driver integrated device of claim 31, wherein the gate driver integrated device is included in a traction inverter of an electric vehicle, and the transistor is coupled to a motor of the electric vehicle.

34. The gate driver integrated device of claim 31, wherein the transistor is a first transistor, the gate terminal is a first gate terminal, and the bootstrap circuit includes:
a diode having an anode and a cathode;
a second transistor having a second gate terminal, a first current terminal, and a second current terminal, the second current terminal coupled to the first terminal; and
a third transistor having a third gate terminal, a third current terminal, and a fourth current terminal, the fourth current terminal coupled to the second current terminal and the first terminal, the third current terminal coupled to the cathode;
wherein the current limiting circuit includes:
a first current limiting circuit having a first current limiting circuit input and a first current limiting circuit output, the first current limiting circuit input coupled to the anode, and a second current limiting circuit having a second current limiting circuit input and a second current limiting circuit output, the second current limiting circuit input coupled to the anode, and wherein the control stage circuit has a control input, a control reference input, and a control output, the control input coupled to the first current limiting circuit output and the second current limiting circuit output, the control reference input coupled to the second terminal, the control output coupled to the second gate terminal and the third gate terminal.

* * * * *